(12) United States Patent
Fujii et al.

(10) Patent No.: US 7,950,288 B2
(45) Date of Patent: May 31, 2011

(54) PHYSICAL QUANTITY SENSOR

(75) Inventors: Tetsuo Fujii, Toyohashi (JP); Eishi Kawasaki, Kuwana (JP)

(73) Assignee: Denso Corporation, Kariya (JP)

( * ) Notice: Subject to any disclaimer, the term of this patent is extended or adjusted under 35 U.S.C. 154(b) by 56 days.

(21) Appl. No.: 12/385,225

(22) Filed: Apr. 2, 2009

(65) Prior Publication Data

US 2009/0229370 A1   Sep. 17, 2009

Related U.S. Application Data

(63) Continuation of application No. 11/808,774, filed on Jun. 12, 2007, now Pat. No. 7,540,199.

(30) Foreign Application Priority Data

Jun. 13, 2006 (JP) ................................. 2006-163877
Mar. 9, 2007 (JP) ................................. 2007-060596

(51) Int. Cl.
   *G01R 27/26* (2006.01)
(52) U.S. Cl. ....................................................... 73/780
(58) Field of Classification Search .................... 73/777, 73/780

See application file for complete search history.

(56) References Cited

U.S. PATENT DOCUMENTS

| | | |
|---|---|---|
| 5,259,247 A | 11/1993 | Bantien |
| 5,313,836 A | 5/1994 | Fujii et al. |
| 5,461,916 A | 10/1995 | Fujii et al. |
| 5,627,318 A | 5/1997 | Fujii et al. |
| 5,872,024 A | 2/1999 | Fujii et al. |
| 6,167,761 B1 | 1/2001 | Hanzawa et al. |
| 6,171,881 B1 | 1/2001 | Fujii |
| 6,227,049 B1 | 5/2001 | Fujii |
| 6,227,050 B1 | 5/2001 | Fujii et al. |
| 6,244,112 B1 | 6/2001 | Fujii |
| 6,303,986 B1 | 10/2001 | Shook |
| 6,316,840 B1 | 11/2001 | Otani |
| 6,323,550 B1 | 11/2001 | Martin et al. |
| 6,422,078 B2 | 7/2002 | Imai |
| 6,463,803 B2 | 10/2002 | Fujii et al. |
| 6,522,015 B1 | 2/2003 | Glenn et al. |
| 6,550,331 B2 | 4/2003 | Fujii et al. |

(Continued)

FOREIGN PATENT DOCUMENTS

JP   A-63-261739   10/1988

(Continued)

OTHER PUBLICATIONS

"Tire Air Pressure Monitoring Sensor" excerpt from *DEMPA-Shinbun High Technology*, May 13, 2004; Catalog of Infineon Technologies (Discussed on pp. 1 and 2 of Specification) (English translation enclosed).

(Continued)

*Primary Examiner* — Freddie Kirkland, III
(74) *Attorney, Agent, or Firm* — Posz Law Group, PLC

(57) ABSTRACT

A physical quantity sensor for detecting a physical quantity includes: a first substrate having a first physical quantity detection element; a second substrate having a second physical quantity detection element, wherein the second substrate contacts the first substrate; and an accommodation space disposed between the first substrate and the second substrate. The first physical quantity detection element is disposed in the accommodation space. The first physical quantity detection element is protected with the first substrate and the second substrate since the first physical quantity detection element is sealed in the accommodation space.

14 Claims, 20 Drawing Sheets

U.S. PATENT DOCUMENTS

| | | |
|---|---|---|
| 6,584,852 B2 | 7/2003 | Suzuki et al. |
| 6,868,727 B2 | 3/2005 | Fujii et al. |
| 6,883,381 B2 | 4/2005 | Kolb et al. |
| 6,938,486 B2 | 9/2005 | Fujii et al. |
| 6,979,873 B2 | 12/2005 | Fujii |
| 7,009,302 B2 | 3/2006 | Tao |
| 7,040,165 B2 | 5/2006 | Fujii et al. |
| 7,150,195 B2 | 12/2006 | Jacobsen |
| 7,327,004 B2 | 2/2008 | Hattori et al. |
| 7,353,710 B2 | 4/2008 | Oikawa et al. |
| 7,353,711 B2 | 4/2008 | O'Dowd et al. |
| 7,373,834 B2 | 5/2008 | Takahashi |
| 7,373,835 B2 | 5/2008 | Matsubara |
| 7,377,175 B2 | 5/2008 | Matsubara |
| 7,392,706 B2 | 7/2008 | Momose et al. |
| 7,407,827 B2 | 8/2008 | Fujii et al. |
| 7,540,199 B2 * | 6/2009 | Fujii et al. ........................ 73/780 |
| 7,706,149 B2 * | 4/2010 | Yang et al. ...................... 361/792 |
| 2001/0001931 A1 | 5/2001 | Fujii et al. |
| 2001/0009110 A1 | 7/2001 | Tmai |
| 2001/0032509 A1 | 10/2001 | Fujii |
| 2002/0026832 A1 | 3/2002 | Fujii et al. |
| 2003/0005774 A1 | 1/2003 | Suzuki et al. |
| 2003/0019299 A1 | 1/2003 | Horie et al. |
| 2004/0050162 A1 | 3/2004 | Fujii et al. |
| 2004/0055385 A1 | 3/2004 | Kolb et al. |
| 2005/0005697 A1 | 1/2005 | Fujii et al. |
| 2005/0132800 A1 | 6/2005 | Fujii et al. |
| 2005/0229710 A1 | 10/2005 | O'Dowd et al. |
| 2006/0019421 A1 | 1/2006 | Jujii et al. |
| 2006/0055001 A1 | 3/2006 | Fujii |
| 2007/0095148 A1 | 5/2007 | Takahashi |
| 2007/0158822 A1 | 7/2007 | Fujii |
| 2008/0030205 A1 * | 2/2008 | Fujii et al. ...................... 324/661 |
| 2008/0099862 A1 | 5/2008 | Fujii et al. |

FOREIGN PATENT DOCUMENTS

| | | |
|---|---|---|
| JP | A-6-347475 | 12/1994 |
| JP | A-10-185719 | 7/1998 |
| JP | A-2002-286571 | 10/2002 |
| JP | A-2003-046091 | 2/2003 |
| JP | A-2005-037309 | 2/2005 |
| WO | WO 2005052534 A1 * | 6/2005 |
| WO | WO 2006/061073 | 6/2006 |

OTHER PUBLICATIONS

Office Action dated Feb. 6, 2009 issued from the German Patent Office for counterpart application No. 10 2007 027 127.3-54 (English translation enclosed).

Office Action mailed Feb. 10, 2010 from German Patent Office in corresponding DE Application No. 10 2007 027 127.3-54 (and English translation).

* cited by examiner

PHYSICAL QUANTITY SENSOR

CROSS REFERENCE TO RELATED APPLICATIONS

This application is a continuation of U.S. application Ser. No. 11/808,774, which was filed on Jun. 12, 2007 and is based on Japanese Patent Applications No. 2006-163877 filed on Jun. 13, 2006, and No. 2007-60596 filed on Mar. 9, 2007, the disclosures of which are incorporated herein by reference.

FIELD OF THE INVENTION

The present invention relates to a physical quantity sensor.

BACKGROUND OF THE INVENTION

As technical ideas capable of combining pressure sensors with other dynamic amount (i.e., physical quantity) detecting sensors in module forms, one technical idea is disclosed in JP-A-2002-286571, and another technical idea is described in Japanese magazine "DEMPA-SHINBUN HIGH TECHNOLOGY" issued by DEMPA-SHINBUN newspaper publisher on May 13, 2004.

The technical idea disclosed in JP-A-2002-286571 is related to the pressure speed sensor equipped with the pressure detecting function for detecting the air pressure of the tire and the speed detecting function for detecting the rotation speed of the tire. The pressure speed sensor is equipped with the diaphragm which receives pressure, the movable electrode and the fixed electrode which detect pressure, and the movable electrode and the fixed electrode which detect speeds. These pressure detecting movable and fixed electrodes, and the speed detecting movable and fixed electrodes are provided within the reference pressure chamber which has been hermetically closed by the housing. Both pressure and speeds are detected based upon changes in electrostatic capacitances between the movable electrodes and the fixed electrodes. Then, since the respective movable and fixed electrodes of this pressure/speed sensor are provided within the reference pressure chamber, it is possible to avoid that these movable and fixed electrodes are corroded by adhering dust and by applying acids to these electrodes.

The Japanese magazine "DEMPA-SHINBUN HIGH TECHNOLOGY" describes the tire air pressure sensor in which the pressure detecting sensor equipped with the pressure detecting function and the acceleration sensor equipped with the acceleration detecting function have been integrated in the same die. In the tire air pressure sensor, the pressure sensor (piezoelectric resistor) is equipped on the plane of the pressure film on the side of the reference pressure chamber so as to detect deformations of this pressure film, and thus, the tire air pressure is sensed based upon the detected deformations of the pressure film which separates the hermetically-closed reference pressure chamber from the air inside the tire. Also, the acceleration sensor has been provided within another hermetically-closed space which is different from the reference pressure chamber. As previously explained, since the pressure sensor and the acceleration sensor are provided within the hermetically-closed space, both the pressure and acceleration sensors can be protected from various sorts of chemical substances (remaining substances, soap, water, and the like in tire hardening process) which are present within tires.

Also, JP-A-6-347475 discloses such a structure that the acceleration sensor having the movable portion and the fixed portion, and the signal processing circuit for processing the output signal of the acceleration sensor have been stored in the package.

The technical idea disclosed in JP-A-2002-286571 has the following problems: That is, not only the structure of the sensor is made complex, but also the large number of structural members are required. Furthermore, since there are many joined portions, the air tight characteristic may be deteriorated. In addition, since these sensors must be separately manufactured, characteristic aspects of these sensors may be readily fluctuated. As a result, the technical idea disclosed in JP-A-2002-286571 has another problem that a large number of sensors having high precision can be hardly manufactured. On the other hand, the apparatus described in the Japanese magazine "DEMPA-SHINBUN HIGH TECHNOLOGY" has the following problem. That is, since the pressure sensor and the acceleration sensor are arrayed side by side to be integrated within the same die, the area occupied by these sensors becomes bulky. Furthermore, as explained in JP-A-6-347475, in the case where the sensor portion and the signal processing circuit are arranged on the same plane, there is another problem that the sensor area defined by combining the sensor unit with the signal processing circuit becomes bulky.

Thus, it is required for a physical quantity sensor to correctly sense physical quantity (i.e., dynamic amounts), and to have a structure by which an area occupied by a sensor is not made bulky.

SUMMARY OF THE INVENTION

In view of the above-described problem, it is an object of the present disclosure to provide a physical quantity sensor.

According to a first aspect of the present disclosure, a physical quantity sensor for detecting a physical quantity includes: a first substrate having a first physical quantity detection element; a second substrate having a second physical quantity detection element, wherein the second substrate contacts the first substrate; and an accommodation space disposed between the first substrate and the second substrate. The first physical quantity detection element is disposed in the accommodation space.

Since the first physical quantity detection element is accommodated in the accommodation space, the first physical quantity detection element is protected.

Alternatively, the first physical quantity detection element may face the second physical quantity detection element. In this case, the sensor is minimized, compared with a sensor in which a first element and a second element are arranged laterally.

Alternatively, the first substrate may further include a support layer, an insulation layer, a conductive layer and a lower wiring. The support layer, the insulation layer and the conductive layer are stacked in this order. The first physical quantity detection element is disposed in the conductive layer. The lower wiring is sandwiched between the insulation layer and the conductive layer. The first physical quantity detection element is coupled with the second substrate through the lower wiring. This lower wiring provides strong construction, compared with a wire bonding sensor.

According to a second aspect of the present disclosure, a physical quantity sensor for detecting a physical quantity includes: a first substrate having a first physical quantity detection element; and a second substrate having at least a processing circuit for processing an output signal from the first physical quantity detection element. The second substrate faces and contacts the first substrate so that an accommodation space is provided between the first substrate and the second substrate.

In this case, the dimensions of the sensor are minimized.

Alternatively, the processing circuit on the second substrate is opposite to the first substrate. In this case, the output signal from the processing circuit is easily retrieved. For example, a part of the protection film for covering an output wiring from the processing circuit is removed so that the output wiring is exposed from the protection film. Thus, the output signal from the processing circuit is easily retrieved.

Further, the second substrate may further include a concavity, which is disposed opposite to the processing circuit. The accommodation space is provided between the concavity and the first substrate. In this case, the accommodation space is provided without a spacer between the first and second substrates. Further, even when a spacer is formed between the first and second substrates, the accommodation space becomes larger than a case where the second substrate includes no concavity.

BRIEF DESCRIPTION OF THE DRAWINGS

The above and other objects, features and advantages of the present invention will become more apparent from the following detailed description made with reference to the accompanying drawings. In the drawings:

FIG. 1A is a plan view of the composite type dynamic amount sensor, FIG. 1B is a sectional view of the sensor taken along a line IB-IB of FIG. 1A, and FIG. 1C is a sectional view thereof taken along a line IC-IC of FIG. 1A;

FIG. 9A is a sectional view of the sensor taken along a line IXA-IXA of FIGS. 9B and 9C, FIG. 9B is a sectional view thereof taken along a line IXB-IXB of FIG. 9A, and FIG. 9C is a sectional view thereof taken along a line IXC-IXC of FIG. 9A;

FIG. 10A is a sectional view of the sensor taken along a line XA-XA of FIGS. 10B and 10C, FIG. 10B is a sectional view thereof taken along a line XB-XB of FIG. 10A, and FIG. 10C is a sectional view thereof taken along a line XC-XC of FIG. 10A;

FIG. 22A is a sectional view of the sensor taken along a line XXIIA-XXIIA of FIG. 21, and FIG. 22B is a sectional view thereof taken along a line XXIIB-XXIIB of FIG. 21;

DETAILED DESCRIPTION OF THE PREFERRED EMBODIMENTS

First Embodiment

In a first embodiment, a description is made of a composite type dynamic amount sensor 1 by employing FIG. 1A to FIG. 8B and FIG. 36.

Figure 1A:
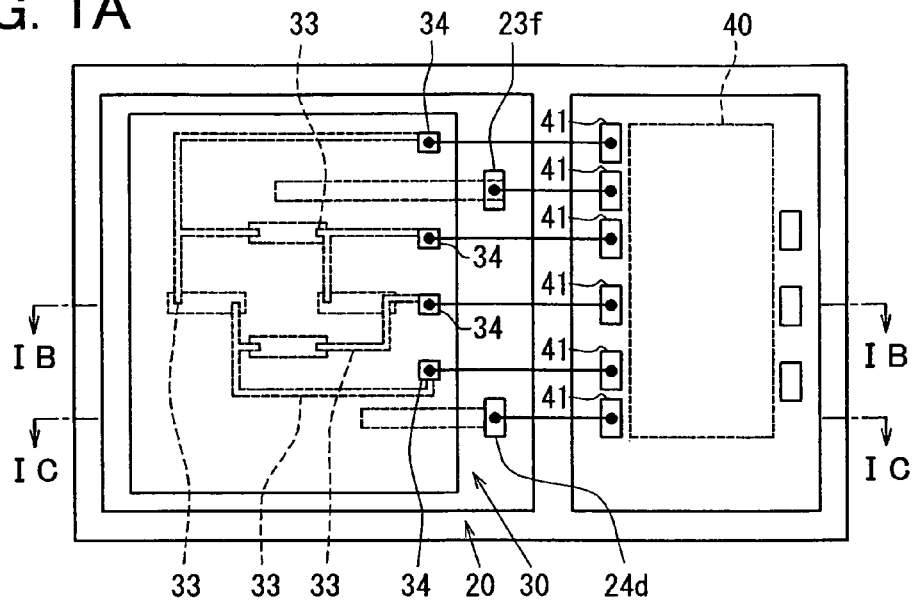
FIG. 1A to FIG. 1C are diagrams for showing a composite type dynamic amount sensor according to a first embodiment.
Figure 1B:
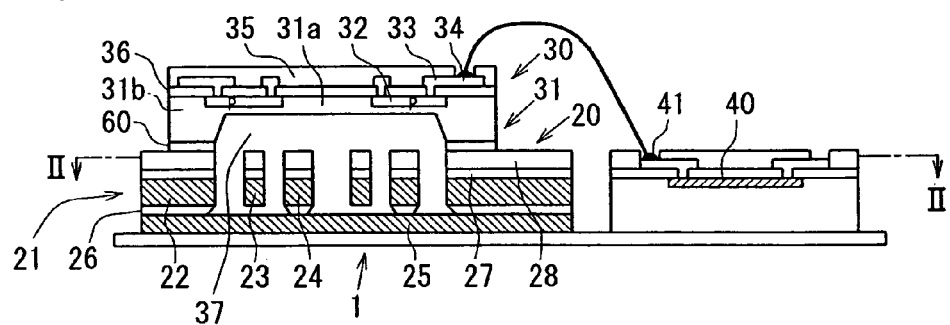
Figure 1C:
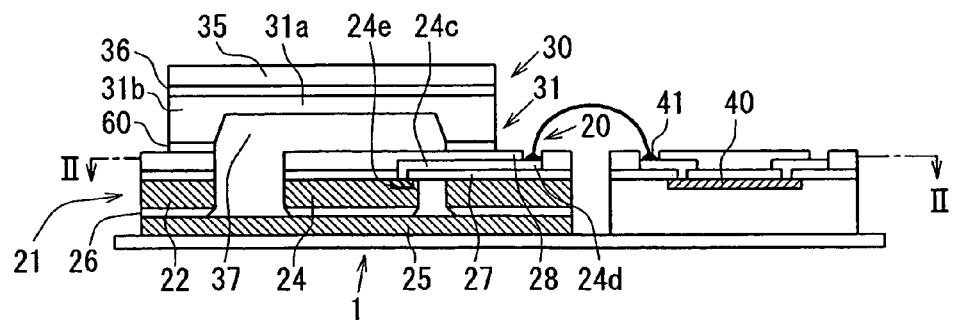
Figure 2:
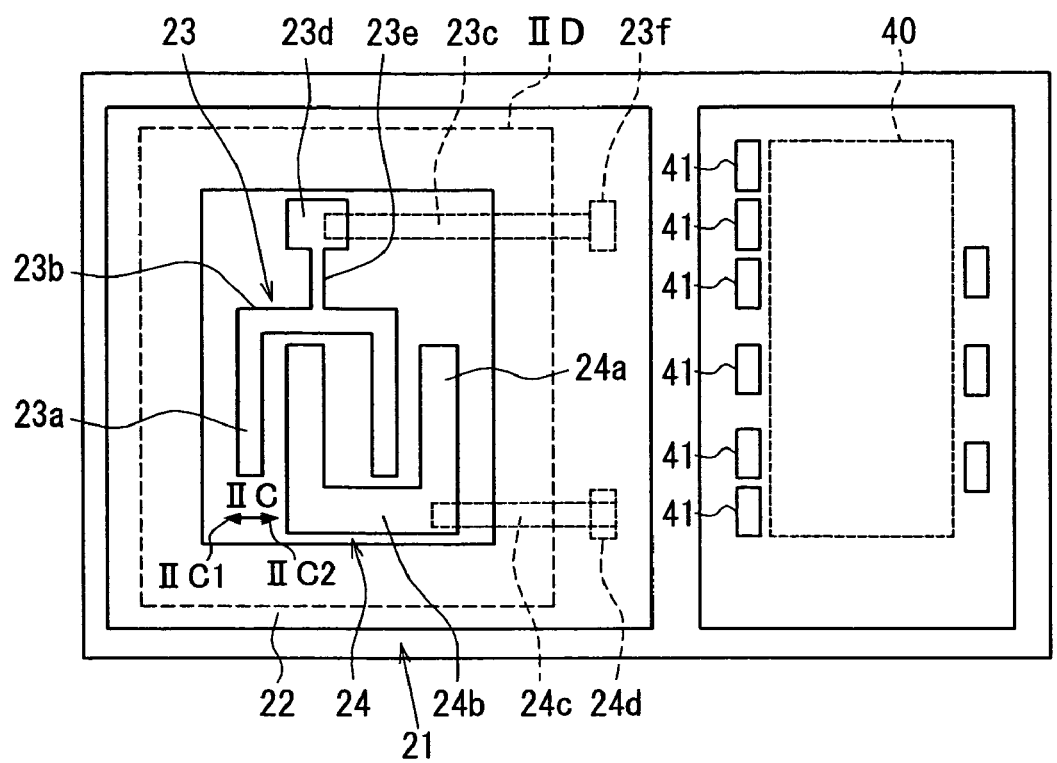
FIG. 2 is a sectional view for showing the sensor taken along a line II-II of FIG. 1B and FIG. 1C.

FIG. 1A is a plan view of the composite type dynamic amount sensor 1; FIG. 1B is a sectional view of the sensor 1 taken along a line IB-IB of FIG. 1A; and FIG. 1C is a sectional view thereof taken along a line IC-IC of FIG. 1A. FIG. 2 is a sectional view for showing the sensor 1 taken along a line II-II of FIG. 1B and FIG. 1C.

As indicated in FIG. 1A to FIG. 1C and FIG. 2, the composite type dynamic amount sensor 1 is constructed in such a way that a piezoelectric type pressure sensor 30 has been stacked on an N type silicon substrate 21 where a capacitance type acceleration sensor 20 has been formed in such a manner that the capacitance type acceleration sensor 20 is sealed. Also, the composite type dynamic amount sensor 1 has been mounted in the same package 50 for packaging a processing circuit 40 which processes an output of the composite type dynamic amount sensor 1.

A first description is made of the piezoelectric type pressure sensor 30 with reference to FIG. 1A to FIG. 1C. The piezoelectric type pressure sensor 30 is constituted by a diaphragm 31 having a concave shape, 4 pieces of piezoelectric resistors 32 in total, 4 pieces of pressure sensor-purpose wiring lines 33, 4 pieces of pressure sensor-purpose pads 34, and a surface protection film 35 for protecting surfaces of the pressure sensor-purpose wiring lines 33. The diaphragm 31 has been formed by etching an N type silicon substrate 31c. The piezoelectric resistors 32 are provided in a deforming portion 31a of the diaphragm 31, and detect deformation of the deforming portion 31a along a direction perpendicular to an elongation direction of the deforming portion 31a so as to output the detected deformation. The pressure sensor-purpose wiring lines 33 transfer the outputs of the respective piezoelectric resistors 32. The pressure sensor-purpose pads 34 have been connected to the respective pressure sensor-purpose wiring lines 33. This deforming portion 31a constitutes a concave button plane of the diaphragm 31, and if pressure is applied to the deforming portion 31a, then the deforming portion 31a is deformed. While the deforming portion 31a has a structure surrounded by a ground frame 31b, the diaphragm 31 has been constructed of the deforming portion 31a and the ground frame 31b.

Four pieces of the piezoelectric resistors 32 are internally provided on a plane located opposite to the concave bottom plane of the deforming portion 31a. Although not shown in the drawings, these piezoelectric resistors 32 have constituted a bridge circuit. The pressure sensor-purpose wiring lines 33, the pressure sensor-purpose pads 34, and the surface protection film 35 have been set on the plane on the side where the piezoelectric resistors 32 are internally provided. Then, the respective pressure sensor-purpose pads 34 are electrically connected to the respective processing circuit-purpose pads 41 coupled to the processing circuit 40 by employing a wire bonding. It should be understood that the diaphragm 31 has such a dimension capable of sealing the capacitance type acceleration sensor 20 within a sealing space formed by the diaphragm 31 and an outer frame 22 (will be explained later). Then, the above-described sealing space constitutes a reference pressure chamber 37 of the pressure sensor.

Figure 36:
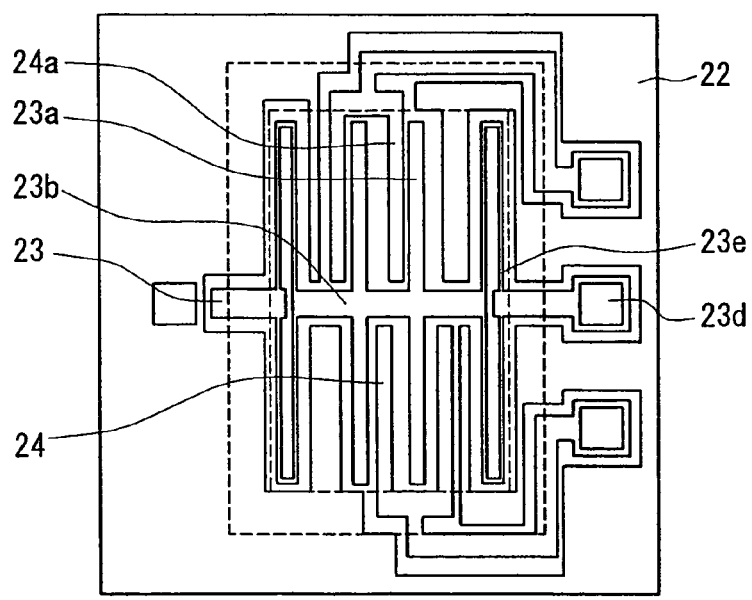
FIG. 36 shows a detailed diagram of the capacitance type acceleration sensor indicated in the first embodiment.

Next, the capacitance type acceleration sensor 20 will now be described with reference to FIG. 1B, FIG. 1C, and FIG. 2. It should be understood that although the diagrams shown in FIG. 1B, FIG. 1C and FIG. 2 exemplify a basic idea of the capacitance type acceleration sensor 20, namely, a cantilever, a double camber beam and a multiple camber beam may be alternatively employed. One example of actual concrete structures is indicated in FIG. 36.

The capacitance type acceleration sensor 20 has been formed by a movable portion 23 and a fixed portion 24, while an entire circumference of the capacitance type acceleration sensor 20 has been surrounded by an outer frame 22 by separating a gap. As will be described later with reference to FIG. 5A, FIG. 5B, FIG. 6A and FIG. 6B, the outer frame 22, the movable portion 23, and the fixed portion 24 have been formed by etching the N type silicon substrate 21.

As shown in FIG. 2, the movable portion 23 has been constituted by 2 pieces of movable electrodes 23a, a weight 23b which joins these movable electrodes 23a, a pillar 23d to which a movable portion-purpose wiring line 23c is connected, and a beam 23e which joins the weight 23b and the pillar 23d. As indicated in FIG. 1B, the movable electrode 23a has a gap between a supporting substrate 25 and the own movable electrode 23a. Similarly to the movable electrode 23a, the weight 23b and the beam 23e have a gap between the supporting substrate 25 and the weight 23b and the beam 23e although not shown in the figure. On the other hand, the pillar 23d has been fixed on an insulating film 26 stacked on the supporting substrate 25. Since the capacitance type acceleration sensor 20 is equipped with such a structure, the beam 23e causes the pillar 23d to be distorted along a direction "IIC" of FIG. 2, so that both the weight 23b and the movable electrode 23a are displaced along the direction "IIC."

Also, the movable portion-purpose wiring line 23c connected to the pillar 23d has joined the movable portion-purpose pad 23f provided on the outer frame 22 to the pillar 23d under bridging condition. Then, while a predetermined voltage (or predetermined current) is applied to the movable portion-purpose pad 23f, the same voltage (or same current) as that of the movable portion-purpose pad 23f is applied also to the movable electrode 23a via the movable portion-purpose wiring line 23c.

On the other hand, as shown in FIG. 2, the fixed portion 24 is made of 2 pieces of fixed electrodes 24a, a coupling portion 24b, and a fixed portion-purpose wiring line 24c. These two fixed electrodes 24a are located opposite to the above-described respective movable electrodes 23a. The coupling portion 24b joins these fixed electrodes 24a. The two fixed electrodes 24a and the coupling portion 24b have been constructed on the insulating film 26. The fixed portion-purpose wiring line 24c has joined the fixed portion-purpose pad 24d provided on the outer frame 22 to the coupling portion 24b under bridging condition. Then, while a predetermined voltage (or predetermined current) is applied to the fixed portion-purpose pad 24d, the same voltage (or same current) as that of the fixed portion-purpose pad 24d is applied also to the fixed electrode 24a via the fixed portion-purpose wiring line 24c.

Since such a structure is provided, if acceleration is applied to the capacitance type acceleration sensor 20 along the direction "IIC", then the movable electrode 23a is displaced along the direction "IIC" to approach the fixed electrode 24a, while the pillar 23d of the movable portion 23 is set to a fulcrum. At this time, an electrostatic capacitance between the movable electrode 23a and the fixed electrode 24a is changed with respect to an electrostatic capacitance of such a condition that acceleration is not applied. Concretely speaking, in such a case where acceleration is applied along a direction "IIC1" of FIG. 2, the fixed electrode 24a is separated from the movable electrode 23a, so that the electrostatic capacitance is decreased. Conversely, in such a case where acceleration is applied along a direction "IIC2" of FIG. 2, the fixed electrode 24a approaches to the movable electrode 23a, so that the electrostatic capacitance is increased. In other words, magnitudes of the applied acceleration may correspond to the increase/decrease of the electrostatic capacitances.

Then, a change in the electrostatic capacitances is detected by comparing a voltage (or current) transferred to the movable portion-purpose pad 23f via the movable portion-purpose wiring line 23c which joins the movable portion 23 and the outer frame 22 with another voltage (or current) transferred to the fixed portion-purpose pad 24d via the fixed portion-purpose wiring line 24c which joins the fixed portion 24 and the outer frame 22 by the processing circuit 40. Concretely speaking, as shown in FIG. 1A, FIG. 1C, and FIG. 2, while the movable portion-purpose pad 23f and the fixed portion-purpose 24d are connected to the corresponding processing circuit-purpose pads 41 by the wire bonding manner, the voltages (currents) which are inputted from the respective processing circuit-purpose pads 41 are compared with each other by the processing circuit 40 so as to detect the applied acceleration.

Also, a frame "IID" indicated in FIG. 2 shows an outer fence of the ground frame 31b of the diaphragm 31 in such a case where the piezoelectric type pressure sensor 30 is stacked on the outer frame 22 which surrounds the capacitance type acceleration sensor 20. As represented in FIG. 2, both the movable portion 23 and the fixed portion 24 have been sealed inside a sealing space which is formed by the outer frame 22 and the diaphragm 31.

It should be noted that in order to prevent from being short-circuited between the movable portion-purpose wiring line 23c and the fixed portion-purpose wiring line 24c, the movable portion-purpose wiring line 23c and the fixed portion-purpose wiring line 24c have been set via an SiN film 27 on the outer frame 22, and have been covered by the surface protection film 28 except for such portions which will constitute the movable portion-purpose pad 23f and the fixed portion-purpose pad 24d.

Figure 3A:
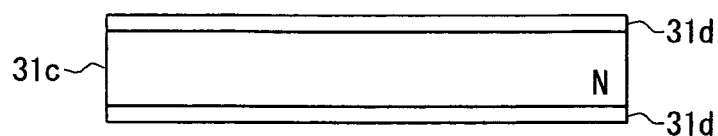
FIG. 3A to FIG. 3H are diagrams for representing manufacturing steps of a piezoelectric type pressure sensor for indicating the first embodiment.

Referring now to FIG. 3A to FIG. 3H, a description is made of steps for manufacturing the piezoelectric type pressure sensor 30. In the beginning, as indicated in FIG. 3A, an N type silicon substrate 31c is prepared, and then, an insulating film (SiO$_2$) 31d is formed on both planes of this N type silicon substrate 31c. It is desirable that a thickness of the N type silicon substrate 31c is approximately 400 µm.

Figure 3B:
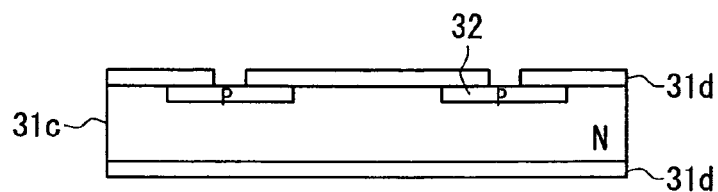

Next, a photo-resist mask is formed on the insulating film (SiO$_2$) 31d of FIG. 3A, and an etching process is further carried out so as to remove a portion of the insulating film 31d. Then, in the N type silicon substrate 31c, an impurity is diffused from a vapor phase in a portion from which the insulating film 31d has been removed and which has been exposed. Alternatively, ions of P type boron may be implanted so as to form a P type region containing the piezoelectric resistors 32 as indicated in FIG. 3B, while a depth of this P type region is made in approximately 0.5 µm to 1.0 µm.

Figure 3C:
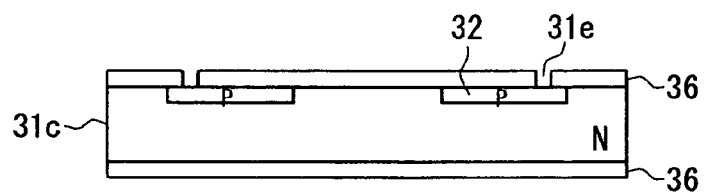

Next, after the photo-resist mask and the insulating film 31d formed on the plane of the N type silicon substrate 31c on the piezoelectric resistor forming side are once removed, an insulating film 36 is once formed on one plane, and both a photo-resist mask is formed and an etching process is carried out so as to form a contact hole 31e as an oxide film, as shown in FIG. 3C. This contact hole 31e is provided at such a position that this contact hole 31e becomes the ground frame 31b when the piezoelectric type pressure sensor 30 is accomplished.

Figure 3D:
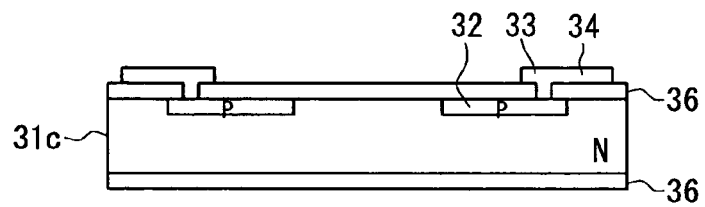

Then, as shown in FIG. 3D, both a pressure sensor-purpose wiring line 33 and a pressure sensor-purpose pad 34 are provided in and on the contact hole 31e and the insulating film 36 by vapor-depositing either aluminum or poly-silicon.

Figure 3E:
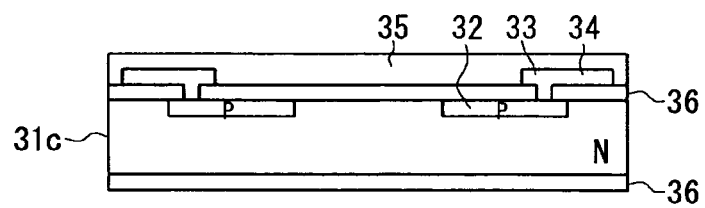

Next, as shown in FIG. 3E, an SiN film which constitutes the surface protection film 35 is provided on the side where the pressure sensor-purpose wiring line 33 and the pressure sensor-purpose pad 34 of FIG. 3D have been provided.

Figure 3F:
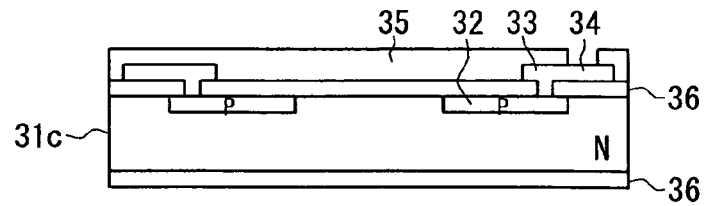

Then, as shown in FIG. 3F, the surface protection film 35 of such a portion is removed which constitutes the pressure sensor-purpose pad 34 when the piezoelectric type pressure sensor 30 is accomplished, in order that either aluminum or poly-silicon of the under layer is exposed.

Figure 3G:
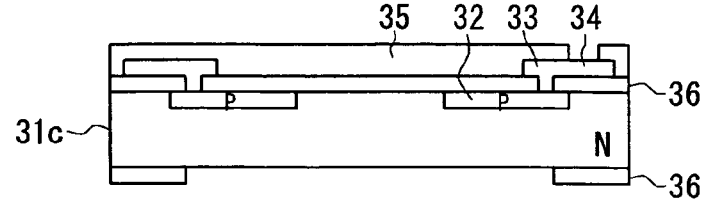

Next, as shown in FIG. 3G, in the N type silicon substrate 31c, a portion of the insulating film 36 is removed which has been formed on the plane located opposite to the plane on the piezoelectric resistor forming side. The region of the insulating film 36 to be removed corresponds to such a portion which becomes a concave portion when a diaphragm is completed, namely a portion which constitutes the deforming portion 31a.

Figure 3H:
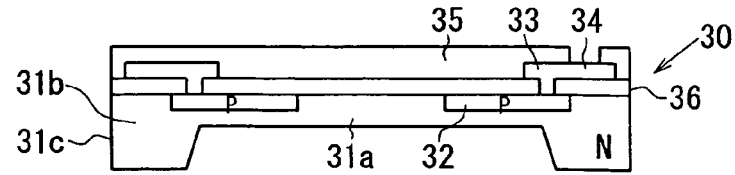

Finally, as indicated in FIG. 3H, since the region from which the insulating film 31d has been removed in FIG. 3G is etched, a portion of the N type silicon substrate 31 is removed so as to form the concave portion. Since the above-described manufacturing steps are carried out, the piezoelectric type pressure sensor 30 is accomplished.

Next, a description is made of steps for manufacturing the capacitance type acceleration sensor 20 with reference to FIG. 4A to FIG. 4D, FIG. 5A to FIG. 5B, and FIG. 6A to FIG. 6B.

Referring now to FIG. 4A to FIG. 4D, a description is made of steps for manufacturing the fixed portion-purpose wiring line 24c.

In the beginning, a high concentration N type silicon substrate 21 is prepared, the resistivity of which is 0.1 to 0.001 Ω·cm, and then, an insulating film 26 is formed on one plane of the N type silicon substrate 21 by executing a thermal oxidation. Then, another silicon substrate (supporting substrate 25) is directly joined to the N type silicon substrate 21 where the insulating film 26 has been formed on one plane thereof in a furnace whose temperature is approximately 1000° C., so that a structure shown in FIG. 4A is obtained.

Figure 4A:
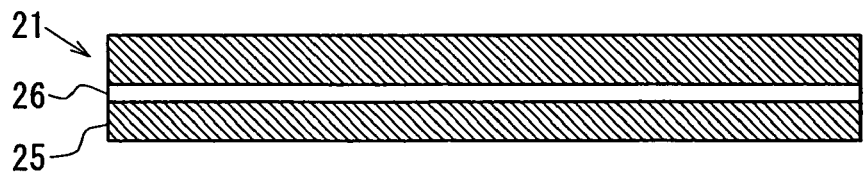
FIG. 4A to FIG. 4D are diagrams for showing setting steps of fixed portion-purpose wiring lines employed in the first embodiment.
Figure 4B:
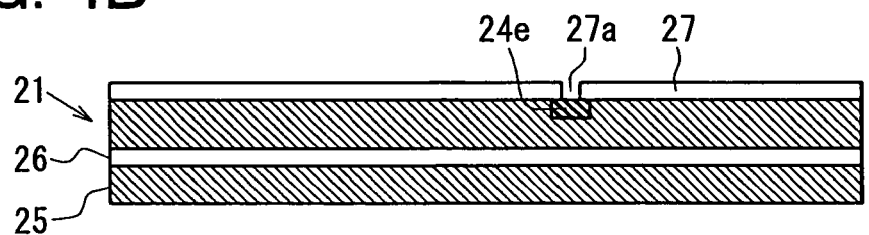

Further, a SiN film 27 (insulating film) is formed on the structure of FIG. 4A, and a photo-resist etching process is carried out so as to form a contact hole 27a in a portion of this SiN film 27. It should be noted also that this contact hole 27a is formed in such a portion which will become a fixed portion 24 when the capacitance type acceleration sensor 20 is accomplished, and to which the fixed portion-purpose wiring line 24c is connected. Then, an ion implantation is carried out via the contact hole 27a so as to form an N+ region 24e, so that such a structure as indicated in FIG. 4B is obtained. It should also be understood that when concentration of a high concentration N type silicon substrate is sufficiently high, an ion implantation may be omitted.

Figure 4C:
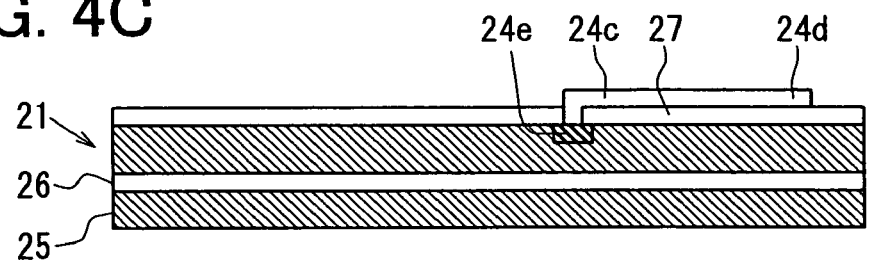

Next, either aluminum or poly-silicon is vapor-deposited on the contact hole 27a and the SiN film 27 of FIG. 4B in order to set either a fixed portion-purpose wiring line 24c or a fixed portion-purpose pad 24d as indicated in FIG. 4C. At this time, the N+ region 24e is being ohmic-contacted to the fixed portion-purpose wiring line 24c.

Figure 4D:
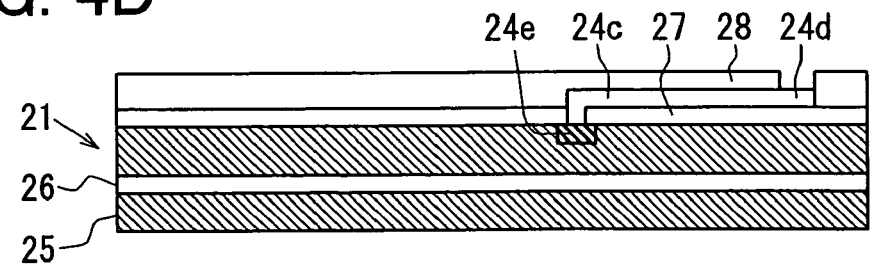

Next, an SiN film which will constitute the surface protection film 28 is formed on the side where the fixed portion-purpose wiring line 24c and the fixed portion-purpose pad 24d have been formed, and as shown in FIG. 4D, the surface protection film 28 of such a portion which will constitute the fixed portion-purpose pad 24d when the fixed portion-purpose wiring line 24c is accomplished is removed.

Since the above-described manufacturing steps are carried out, the fixed portion-purpose wiring line 24c is completed. It should also be noted that since the movable portion-purpose wiring line 23c may be manufactured by the substantially same steps as those of the fixed portion-purpose wiring line 24c, an explanation thereof is omitted.

Subsequently, a method for manufacturing a fixed portion 24 and a movable portion 23 will now be described with reference to FIG. 5A, FIG. 5B, and FIG. 6A, FIG. 6B. It should also be noted that FIG. 5A and FIG. 5B correspond to FIG. 1B before these fixed and movable portions 24 and 23 are manufactured, and also, FIG. 6A and FIG. 6B correspond to FIG. 1C before these fixed and movable portions 24 and 23 are manufactured.

Figure 5A:
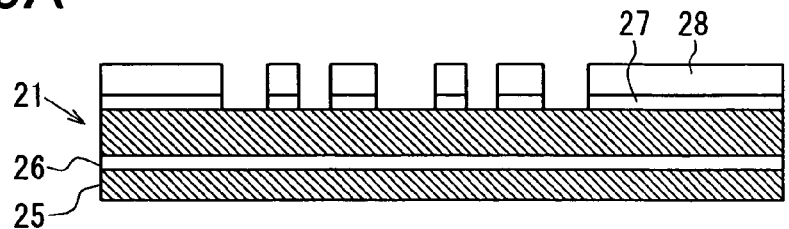
FIG. 5A and FIG. 5B are diagrams for showing steps for manufacturing a fixed portion and a movable portion employed in the first embodiment, which correspond to FIG. 1B before being manufactured.
Figure 6A:
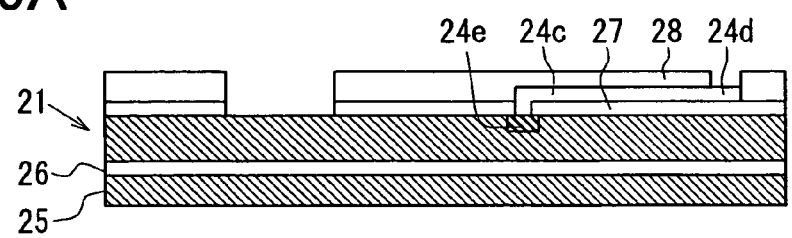
FIG. 6A and FIG. 6B are diagrams for showing steps for manufacturing a fixed portion and a movable portion employed in the first embodiment, which correspond to FIG. 1C before being manufactured.

Firstly, the N type silicon substrate 21 on which the fixed portion-purpose wiring line 24c of FIG. 4D has been accomplished is prepared, and then, as indicated in FIG. 5A and FIG. 6A, a portion of the surface protection films 27, and 28 of the side where the fixed portion-purpose wiring line 24c has been formed is removed. The portion of the surface protection films to be removed corresponds to such a portion which will not constitute the outer frame 22, the movable portion 23, and fixed portion 24 when the fixed and movable portions 24 and 23 are completed.

Figure 5B:
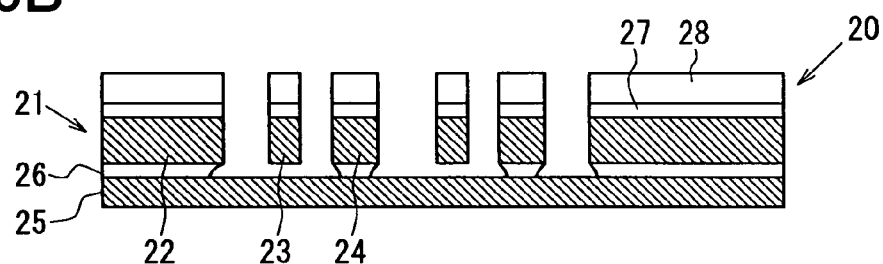
Figure 6B:
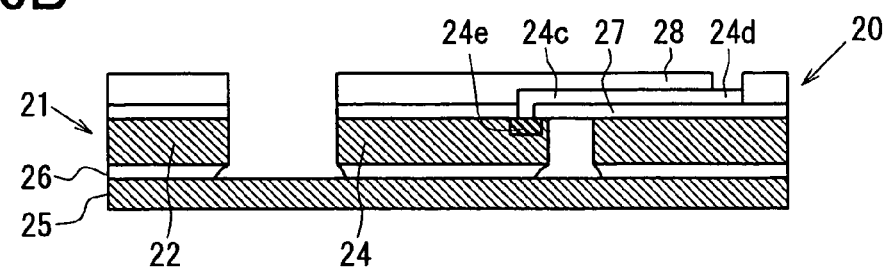

Next, as shown in FIG. 5B and FIG. 6B, the N type silicon substrate 21 at such a portion from which the surface protection films 27 and 28 have been removed is etched in a sacrifice layer etching manner, while the insulating film 26 is employed as a sacrifice layer, in order to form the fixed portion 24, the movable portion 23, and the outer frame 22. The fixed portion 24 has been fixed on the insulating film 26. Only the pillar 23d of the movable portion 23 has been fixed on the insulating film 26. The outer frame 22 surrounds the movable portion 23 and the fixed portion 24. As a result, such a capacitance type acceleration sensor 20 shown in FIG. 2 is accomplished.

Referring now to FIG. 7A, FIG. 7B, FIG. 8A, and FIG. 8B, a description is made of steps for stacking the piezoelectric type pressure sensor 30 on the outer frame 22 which surrounds the capacitance type acceleration sensor 20. It should be understood that FIG. 7A and FIG. 7B correspond to FIG. 1B before the manufacture thereof, and FIG. 8A and FIG. 8B correspond to FIG. 1c before the manufacture thereof.

Figure 7A:
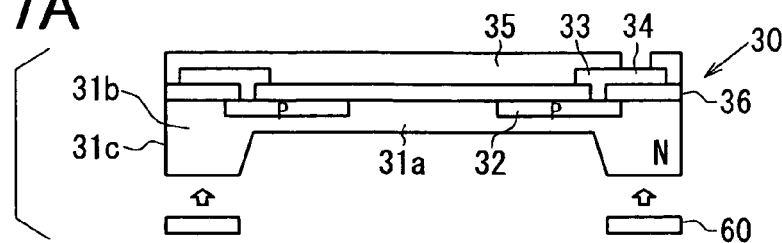
FIG. 7A and FIG. 7B are diagrams for representing steps for stacking the piezoelectric type pressure sensor employed in the first embodiment on a capacitance type acceleration sensor, which correspond to FIG. 1B before being manufactured.
Figure 8A:
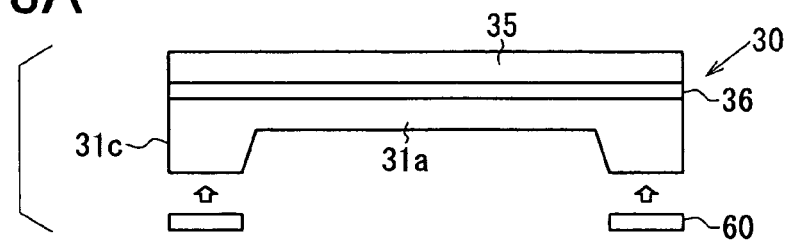
FIG. 8A and FIG. 8B are diagrams for representing steps for stacking the piezoelectric type pressure sensor employed in the first embodiment on a capacitance type acceleration sensor, which correspond to FIG. 1C before being manufactured.

As represented in FIG. 7A and FIG. 8A, low melting point glass 60 having an insulating characteristic and which constitutes an adhesive agent is coated on an edge plane of the deforming portion 31a of the ground frame 31b, which is located on the side of the elongation direction.

Figure 7B:
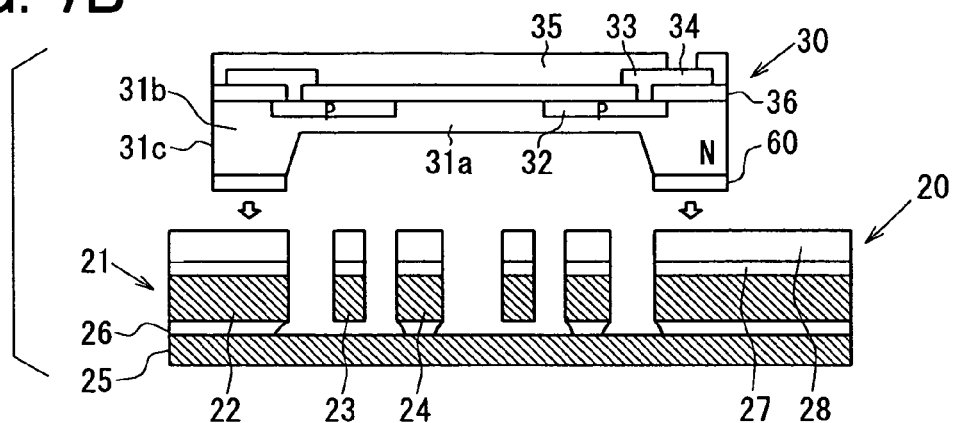
Figure 8B:
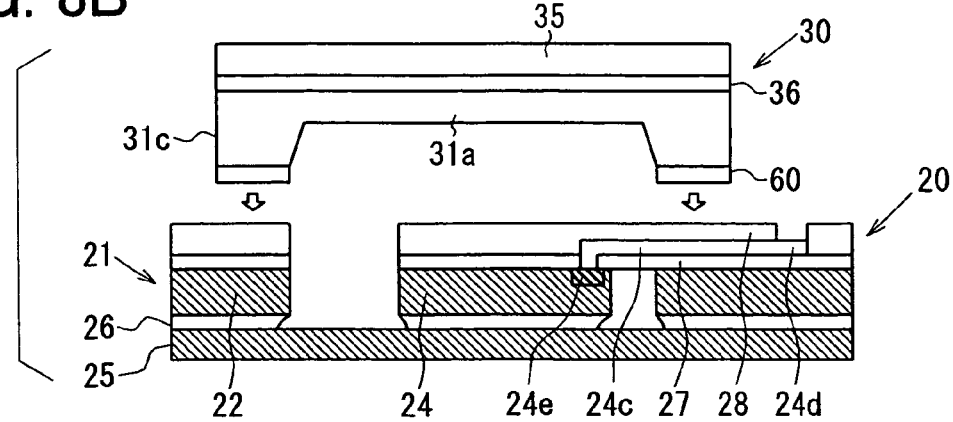

Next, as shown in FIG. 7B and FIG. 8B, the low melting point glass 60 coated on the ground frame 31b is adhered to the outer frame 22 so as to be fixed thereon under vacuum condition. As a result, a sealing space (namely, reference pressure chamber 37) is produced by the diaphragm 31 of the piezoelectric type pressure sensor 30, the outer frame 22, and the insulating film 26, so that both the fixed portion 24 and the movable portion 23 are sealed with this sealing space.

As previously described, the steps for manufacturing the piezoelectric type pressure sensor 30 shown in FIG. 3A to FIG. 3H; the steps for manufacturing the capacitance type acceleration sensor 20 represented in FIG. 4A to FIG. 4D, FIG. 5A to FIG. 5B, and FIG. 6A to FIG. 6B; and also the stacking steps shown in FIG. 7A to FIG. 7B and FIG. 8A to FIG. 8B are sequentially carried out, so that the composite type dynamic amount sensor 1 shown in FIG. 1A to FIG. 1C and FIG. 2 may be constructed.

Subsequently, a description is made of effects of the above-described composite type dynamic amount sensor 1.

As to a first effect, since the capacitance type acceleration sensor 20 is stacked on the piezoelectric type pressure sensor 30, the occupied area of the sensors 20 and the 30 can be reduced, as compared with the conventional structure that the capacitance type acceleration sensor 20 and the piezoelectric type pressure sensor 30 are separately provided.

A description is made of a second effect. In the conventional capacitance type acceleration sensor, in order to avoid that contaminations (particles etc.) are entered to the movable portion, the cap made of glass and the like have been employed so as to seal the movable portion. However, in the case of the composite type dynamic amount sensor 1 of the first embodiment, the movable portion 23 is sealed by the diaphragm 31 of the piezoelectric type pressure sensor 30. As previously explained, the movable portion 23 can be sealed without separately employing the cap.

A third effect is described. As previously described, the capacitance type acceleration sensor 20 and the piezoelectric type pressure sensor 30 have been separately manufactured, and have been stacked on each other, as indicated in FIG. 7A, FIG. 7B, FIG. 8A, and FIG. 8B. As a result, the capacitance type acceleration sensor 20 and the piezoelectric pressure sensor 30 may be employed which are substantially identical to the conventional acceleration and pressure sensors. In other words, the conventional detecting performance can be maintained and these acceleration and pressure sensors 20 and 30 can be stacked on each other, so that the structure thereof need not be made complex, as compared with the conventional sensors. Also, since the joining portion constitutes the joining portion between the ground frame 31b of the diaphragm 31 and the outer frame 22, the air tight characteristic of the joining portion is high.

Also, in the first embodiment, such a case that the reference pressure chamber 37 becomes vacuum has been exemplified. In the case where the reference pressure chamber 37 is not vacuum, such an effect capable of suppressing air dumping may be achieved. Concretely speaking, since the deformation direction of the deforming portion 31a of the diaphragm 31 is directed along such a direction perpendicular to the movable direction of the movable portion 23, even in such a case where the deforming portion 31a is deformed and thus the internal pressure of the reference pressure chamber 37 is increased, the movable portion 23 can be hardly depressed against the fixed portion 24 by receiving this internal pressure. In other words, the internal pressure can hardly give an adverse influence to the distance between the movable portion 23 and the fixed portion 24. As a result, the acceleration can be detected in higher precision.

It should also be noted that it is desirable that in order to suppress the air dumping, the deformation direction of the deforming portion 31a is located perpendicular to the movable direction of the movable portion 23. However, even when the deformation direction is made coincident with the movable direction, it is possible to suppress the air dumping, although the detection precision is slightly lowered.

Second Embodiment

Figure 9A:
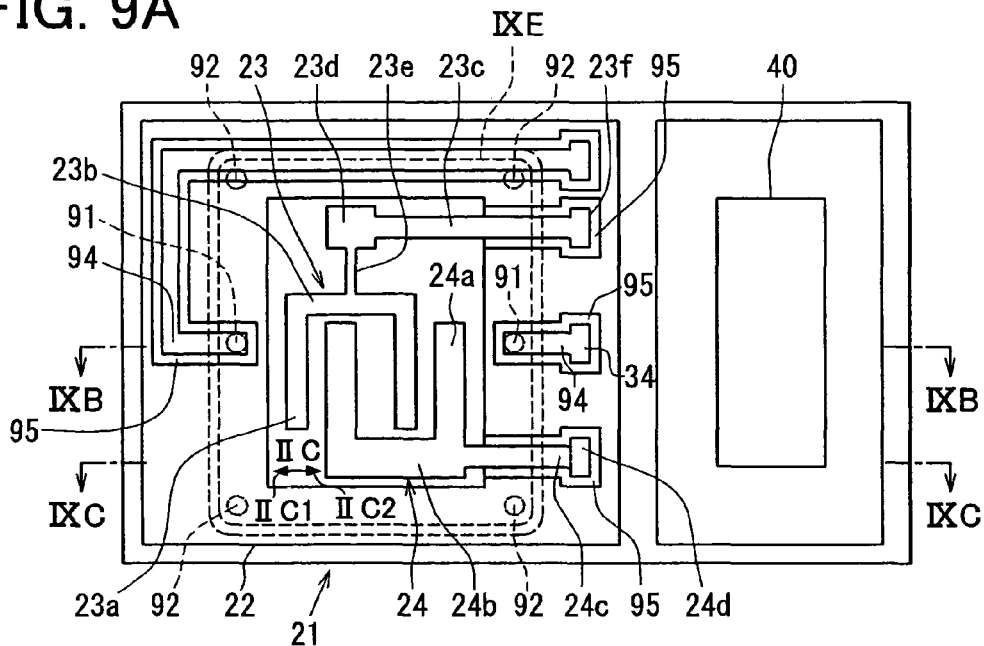
FIG. 9A to FIG. 9C are diagrams for showing a composite type dynamic amount sensor indicated in a second embodiment.
Figure 9B:
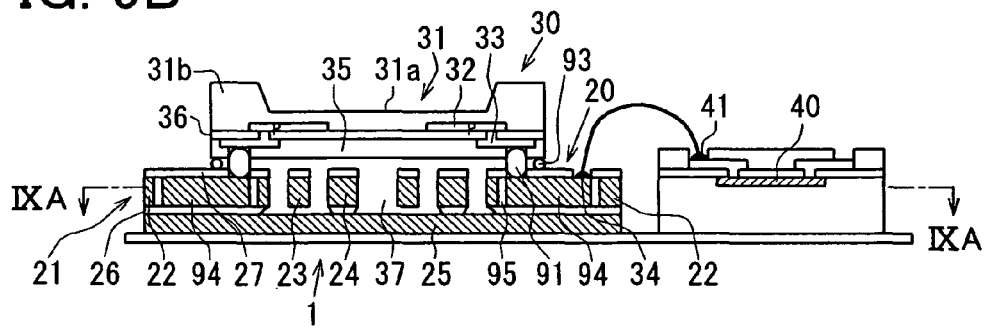
Figure 9C:
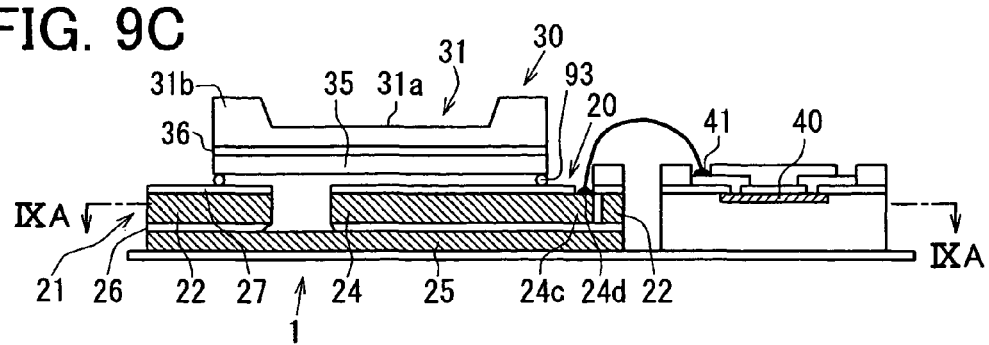

Referring now to FIG. 9A to FIG. 9C, a description is made of a composite type dynamic amount sensor 1 according to a second embodiment. This embodiment is different from the above-described first embodiment as to the following technical point: That is, a piezoelectric type pressure sensor 30 is adhered to a capacitance type acceleration sensor 20 by employing solder 91 and 92, and an air tight characteristic of a reference pressure chamber 37 is secured by an air tight annular ring 93. It should also be noted that the same reference numerals shown in the first embodiment will be employed as those for denoting the same, or similar structures indicated in the second embodiment, and explanations in this embodiment are omitted.

FIG. 9A is a sectional view for indicating the composite type dynamic amount sensor 1 according to the second embodiment, namely such a sectional view, taken along a line IXA-IXA of FIG. 9B and FIG. 9C. Also, FIG. 9B corresponds to FIG. 1B in the first embodiment, and FIG. 9C corresponds to FIG. 1C in the first embodiment.

As shown in FIG. 9B and FIG. 9C, the capacitance type acceleration sensor 20 has been fixed to the piezoelectric type pressure sensor 30 via conducting-purpose solder 91, coupling-purpose solder 92, and the air tight annular ring 93. The air tight annular ring 93 is made of rubber (namely, elastic member) having an annular shape, and is provided in a region "IXE" of FIG. 9A. Alternatively, the air tight annular ring 93 may be formed by solder similar to the above-described conducting-purpose solder 91 and coupling-purpose solder 92. Since air tight connecting and sealing of these sensor 20 and 30 are realized by the solder, the resulting air tight characteristic may be further improved. Then, lumps of the conducting-purpose solder 91 and the coupling-purpose solder 92 are present within the annular shape of this air tight annular ring 93. Both the conducting-purpose solder 91 and the coupling-purpose solder 92 may couple the capacitance type acceleration sensor 20 to the piezoelectric type pressure sensor 30, and also, may depress the air tight annular ring 93 between the capacitance type acceleration sensor 20 and the piezoelectric type pressure sensor 30 so as to sandwich the air tight annular ring 93 so as to maintain the air tight characteristic of the reference pressure chamber 37.

Also, in the first embodiment, the fixed portion-purpose wiring line 24c and the movable portion-purpose wiring line 23c have been provided by employing aluminum, and the like. In this embodiment, as represented in FIG. 9A to FIG. 9C, a portion of the outer frame 22 is insulating-processed so as to form the fixed portion-purpose wiring line 24c, the movable portion-purpose wiring line 23c, and a pressure sensor-purpose wiring line 94. Concretely speaking, as indicated in FIG. 9A, the pressure sensor-purpose wiring line 94 provided at a portion of the outer frame 22 in order to transfer an output signal of the piezoelectric type pressure sensor 30 has been insulated from the outer frame 22 by employing an insulating film 95 such as SiO$_2$. Furthermore, as indicated in FIG. 9B, this pressure sensor-purpose wiring line 94 is electrically conducted via the conducting-purpose solder 91 to the pressure sensor-purpose wiring line 33 provided inside the piezoelectric type pressure sensor 30. In other words, the conducting-purpose solder 91 may achieve two actions: That is, the piezoelectric type pressure sensor 30 is coupled to the capacitance type acceleration sensor 20 under a condition that the air tight annual ring 93 is pushed into; and the output signals of the piezoelectric resistors 32 are transferred to the pressure sensor-purpose wiring line 94. In the pressure sensor-purpose wiring line 94, a terminal portion thereof on the side where the conducting-purpose solder 91 is not set becomes a pressure sensor-purpose pad 34 which is wire-bonded to the processing circuit-purpose pad 41 of the processing circuit 40.

On the other hand, as shown in FIG. 9A, the fixed portion-purpose wiring line 24c constitutes a portion of a coupling portion 24b of the fixed portion 24, and has been electrically insulated from the outer frame 22 by employing the insulating film 95 such as SiO$_2$. It should also be understood that as indicated in FIG. 9A and FIG. 9C, an insulating film 27 has been provided on an entire plane of the fixed portion-purpose wiring line 24c except for a terminal portion of the edge plane on the side of the piezoelectric type pressure sensor 30. Then, in the terminal portion of the fixed portion-purpose wiring line 24c, such a portion where the insulating film 27 is not provided constitutes the fixed portion-purpose pad 24d, while this fixed portion-purpose pad 24d has been connected to the processing circuit purpose pad 41 by a wire bonding manner.

Also, as indicated in FIG. 9A, the movable portion-purpose wiring line 23c elongated to the pillar 23d in an integral body has a substantially same structure as that of the fixed portion-purpose wiring line 24c. Under such a condition that this movable portion-purpose wiring line 23c is insulated from the outer frame 22, a terminal portion of the movable portion-purpose wiring line 23c is exposed and constitutes the movable portion-purpose pad 23f.

As previously described, both the fixed portion-purpose wiring line 24c and the movable portion-purpose wiring line 23c have been electrically insulated from the outer frame 22 and the piezoelectric type pressure sensor 30, and the pressure sensor-purpose wiring line 94 has been electrically insulated from the capacitance type acceleration sensor 20.

Although not shown in the drawing, the coupling-purpose solder 92 has coupled a coupling pad provided in the piezoelectric type pressure sensor 30 to another coupling-purpose pad provided on the outer frame 22. The first-mentioned coupling-purpose pad has been provided in order not to give an adverse influence to an output signal of the piezoelectric type pressure sensor 30, whereas the last-mentioned coupling-purpose pad has been provided in order not to give an adverse influence to an output result obtained from the capacitance type acceleration sensor 20.

Since the above-described structure is employed, the pressure sensor-purpose pad 34, the fixed portion-purpose pad 24d, and the movable portion-purpose pad 23f may be provided to be closed to each other. Furthermore, similar to the first embodiment, the piezoelectric resistors 32 and the pressure sensor-purpose wiring line 33 are sealed in the sealing space of the reference pressure chamber 37, so that both the piezoelectric resistor 32 and the pressure sensor-purpose wiring line 33 can be protected from particles, and the like.

In this embodiment, although the conducting-purpose solder 91 and the coupling-purpose solder 92 are set within the annular shape of the air tight ring 93, the setting places of the conducting-purpose solder 91 and the coupling-purpose solder 92 may be alternatively located outside the annular shape of the air tight ring 93. Furthermore, a total setting number as to the conducting-purpose solder 91 and the coupling-purpose solder 92 may not be alternatively selected to be 6 portions as indicated in FIG. 9A. It is desirable as the setting places of the solder 91 and 92, the setting intervals of the solder become equal to each other, and/or the solder 91 and 92 is set in the vicinity of the corners of the air tight ring 93. However, if the air tight ring 93 can seal the reference pressure chamber 37 constituted by the diaphragm 31 and the outer frame 22, then there is no limitation in the setting numbers and the setting places of the solder.

Also, since the shape of the air tight ring 93 may be merely made in an annular shape, such a substantially rectangular shape as shown in FIG. 9A need not be employed as this shape of the air tight ring 93. Alternatively, a toroidal shape may be employed.

Third Embodiment

Figure 10A:
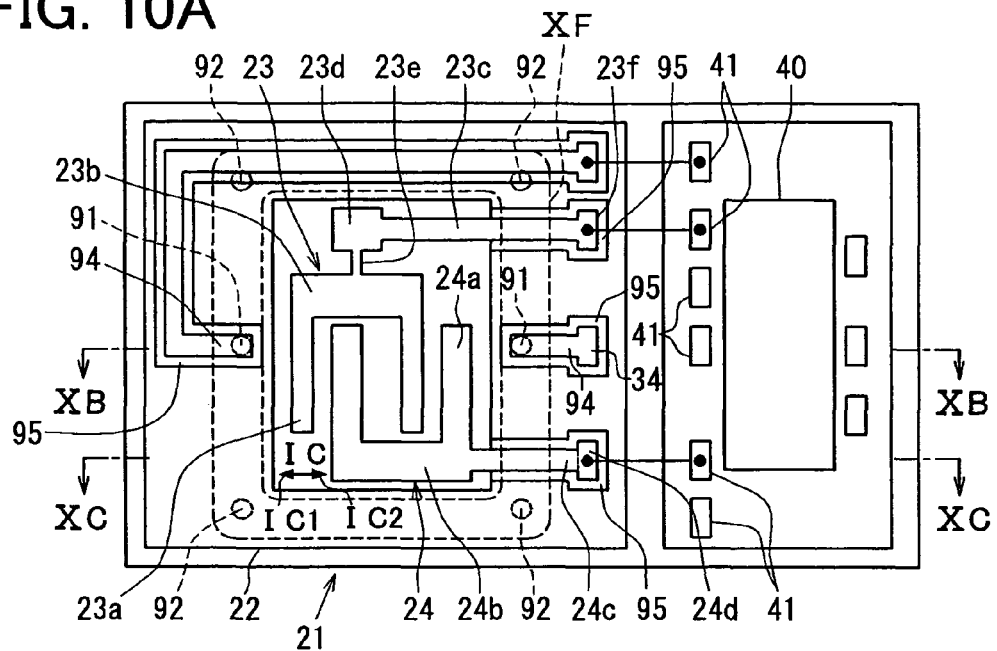
FIG. 10A to FIG. 10C are diagrams for showing a composite type dynamic amount sensor indicated in a third embodiment.
Figure 10B:
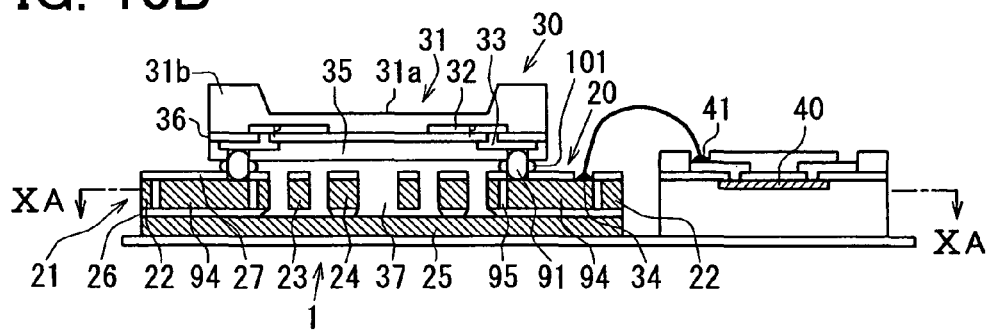
Figure 10C:
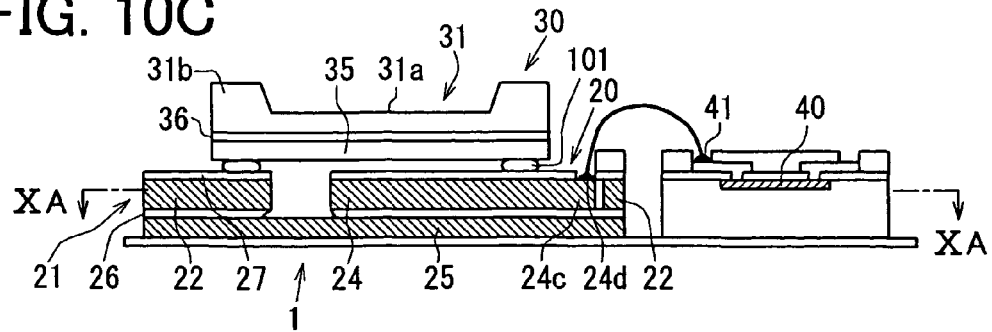

Referring now to FIG. 10A to FIG. 10C, a description is made of a composite type dynamic amount sensor 1 according to a third embodiment. This embodiment is different from the above-described second embodiment as to the following technical point: That is, the air tight characteristic of the reference pressure chamber 37 is secured by employing an NCF (Non-Conductive Film) 101. It should also be noted that the same reference numerals shown in the first embodiment, or the second embodiment will be employed as those for denoting the same, or similar structures indicated in the third embodiment, and explanations in this embodiment are omitted.

FIG. 10A is a sectional view for indicating the composite type dynamic amount sensor 1 according to the third embodiment, namely such a sectional view, taken along a line XA-XA of FIG. 10B and FIG. 10C. Also, FIG. 10B corresponds to FIG. 1B in the first embodiment, and FIG. 10C corresponds to FIG. 1C in the first embodiment.

As shown in FIG. 10B and FIG. 10C, the capacitance type acceleration sensor 20 has been fixed to the piezoelectric type pressure sensor 30 via the conducting-purpose solder 91, the coupling-purpose solder 92, and the NCF 101. This NCF 101 is made of a resin film having a non-conductive characteristic, and the NCF 101 may be joined by way of a crimping manner, a thermal crimping manner, or an adhesive manner. Alternatively, the NCF 101 may be manufactured by a screen printing method, or an ink jet printing method. Since the material of the NCF 101 is made of a resin having an electric insulating characteristic, for example, an epoxy resin, or a polyimide resin, this resin material is softened by receiving heat. Then, heat is continuously applied to this resin material under softened condition, so that the softened resin material may be hardened.

As indicated in a region "XF" of FIG. 10A, this NCF 101 has an annular shape which is located in the vicinity of an inner diameter of the outer frame 22, and which surrounds a region containing a terminal portion of the pressure sensor-purpose wiring line 94 on the side of the reference pressure chamber 37. Then, lumps of the conducting-purpose solder 91 and the coupling-purpose solder 92 are present within the NCF 101.

Next, a description is made of steps for stacking the capacitance type acceleration sensor 20 on the piezoelectric type pressure sensor 30 via the NCF 101.

At a time instant when the piezoelectric type pressure sensor 30 is completed, for example, in FIG. 3H, the above-described conducting-purpose solder 91 is provided as a bump on an exposed portion (namely, pressure sensor-purpose pad in the first embodiment) of the pressure sensor-purpose wiring line 33. If the pressure sensor-purpose wiring line 33 is made of an aluminum material, Ti, Ni, Au are stacked in this order on the pressure sensor-purpose wiring line 33, and then, the conducting-purpose solder 91 is provided on this Au. Similarly, the coupling-purpose solder 92 is provided within the region "XF" (namely, setting scheduled region of NCF 101). Thereafter, the NCF 101 is set by employing a crimping method, or a printing method within the region "XF" in such a manner that the NCF 101 seals the conducting-purpose solder 91 and the coupling-purpose solder 92.

On the other hand, after the fixed portion 24 and the movable portion 23 which constitute the capacitance type acceleration sensor 20, the fixed portion-purpose wiring line 24c and the movable portion-purpose wiring line 23c which have been insulated by the insulating film 95 such as $SiO_2$ from the outer frame 22, and also, the pressure sensor-purpose wiring line 94 have been completed, the conducting-purpose solder 91 is provided as a bump on the pressure sensor-purpose pad 34. Similarly, the coupling-purpose solder 92 is set within the region "XF" (setting scheduled region of NCF 101).

As previously explained, after the NCF 101, the conducting-purpose solder 91, and also the coupling-purpose solder 92 have been set to both the piezoelectric type pressure sensor 30 and the capacitance type acceleration sensor 20, the piezoelectric type pressure sensor 30 is located opposite to the capacitance type acceleration sensor 20, and the NCF 101 is heated at a temperature of approximately 150° C. A positioning operation is carried out in such a manner that the conducting-purpose solder 91 and the coupling-purpose solder 92 of the piezoelectric type pressure sensor 30 are located opposite to the corresponding conducting-purpose solder 91 and the corresponding coupling-purpose solder 92 of the capacitance type acceleration sensor 20, and then, the piezoelectric type pressure sensor 30 is depressed against the capacitance type acceleration sensor 20. As a result, the NCF 101 is broken through by the conducting-purpose solder 91 and the coupling-purpose solder 92 on the side of the capacitance type acceleration sensor 20, so that the both the conducting-purpose solder 91 and the coupling-purpose solder 92 on the side of the capacitance type acceleration sensor 20 are contacted to the corresponding conducting-purpose solder 91 and the corresponding coupling-purpose solder 92 of the piezoelectric type pressure sensor 30. After these solders contact, ultrasonic joining is performed with respect to the respective conducting-purpose solder 91 and the respective coupling-purpose solder 92 so as to be electrically connected to each other.

With employment of the above-described structure, similar operation and effects to those of the second embodiment can be achieved in the third embodiment.

Fourth Embodiment

Figure 11:
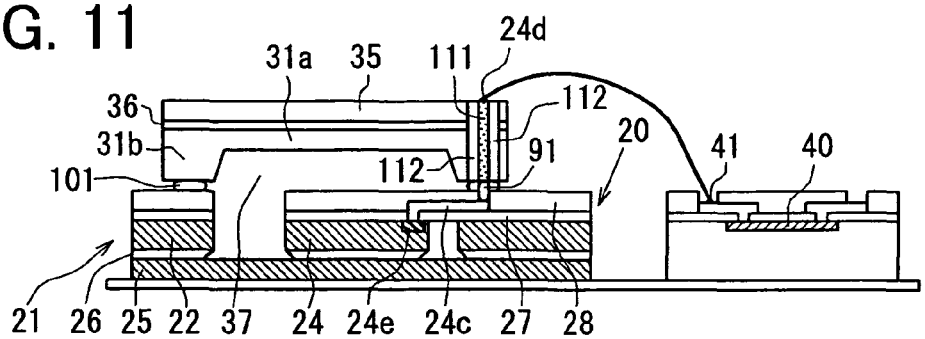
FIG. 11 is a diagram for indicating a composite type dynamic amount sensor which shows a fourth embodiment.

Referring now to FIG. 11, a description is made of a composite type dynamic amount sensor 1 according to a fourth embodiment. The fourth embodiment has the below-mentioned technical different points from those of the first embodiment. That is, in this embodiment, while a penetration electrode 111 is provided on a diaphragm 31, a signal of a capacitance type acceleration sensor 20 can be derived from the diaphragm 31 through the penetration electrode 111. It should be understood that the same reference numerals shown in the above-described respective embodiments will be employed as those for denoting the same, or similar structural elements in the fourth embodiment, and descriptions thereof are omitted.

FIG. 11 is a sectional view for showing the composite type dynamic amount sensor 1 according to the fourth embodiment, and corresponds to FIG. 1C in the first embodiment.

As indicated in FIG. 11, the penetration electrode 111 and an insulating film 112 have been formed on the ground frame 31b of the diaphragm 31. The penetration electrode 111 is located parallel to the deforming direction of the deforming portion 31a. The insulating film 112 insulates the penetration electrode 111 from the diaphragm 31. It should also be noted that the place where the penetration electrode 111 is provided is such a place that when the capacitance type acceleration sensor 20 is adhered to the piezoelectric type pressure sensor 30, this place is located opposite to both the exposed portion (namely, fixed portion-purpose pad of the first embodiment) of the fixed portion-purpose wiring line 24c, and the exposed portion (namely, movable portion-purpose pad of the first embodiment) of the movable portion-purpose wiring line 23c.

Then, the penetration electrode 111 has been connected to the exposed portion of the fixed portion-purpose wiring line 24c, or the exposed portion of the movable portion-purpose wiring line 23c by the conducting-purpose solder 91. Furthermore, in addition to the above-described conducting-purpose solder 91, the coupling-purpose solder 92 employed in the above-explained third embodiment has been provided at such a portion between the capacitance type acceleration sensor 20 and the piezoelectric type pressure sensor 30, which gives a less electrically adverse influence.

Also, similar to the third embodiment, the NCF 101 having the annular shape has been provided between the capacitance type acceleration sensor 20 and the piezoelectric type pressure sensor 30 so as to maintain the air tight characteristic of the reference pressure chamber 37. Alternatively, as shown in the second embodiment, a ring for the air tight sealing may be formed by a ring of solder on either the outer side or the inner side of the penetration electrode 111.

A terminal edge of the penetration electrode 111, which is not connected to either the fixed portion-purpose wiring line 24c or the movable portion-purpose wiring line 23c, has been constituted as either the fixed portion-purpose pad 24d or the movable portion-purpose pad 23f, which is wire-bonded to the processing circuit-purpose pad 41 of the processing circuit 40. It should also be noted that these pads 23f and 24d may also function as the terminal portion of the penetration electrode 111 as shown in FIG. 11, or may be formed as an enlarged portion which is manufactured by vapor-depositing aluminum on the terminal portion in order to be easily wire-bonded.

In this case, a step for forming this penetration electrode 111 is constructed of the following 3 forming steps: a step in which while the ground frame 31b is masked, a reactive ion etching process is carried out so as to form a penetration hole; a step in which this penetration hole is further thermally oxidized in order to form an insulating film 112; and a step in which poly-silicon is grown on the penetration hole reduced by the thermal oxidation, so that the penetration electrode 111 is accomplished. Alternatively, instead of this poly-silicon, such a metal as tungsten, copper, aluminum may be employed.

It should also be understood that the structure of the piezoelectric type pressure sensor 30 is manufactured in such a manner that 2 pieces of the penetration electrodes 111, and the insulating film 112 for insulating these penetration electrodes 111 are additionally provided in the piezoelectric type pressure sensor 30 of the first embodiment, whereas positions of the pressure sensor-purpose wiring line 33 and the pressure sensor-purpose pad 34 are similar to those of the first embodiment.

As previously described, while the penetration electrodes 111 are provided on the diaphragm 31, the penetration electrodes 111, the fixed portion-purpose wiring line 24c, and the movable portion-purpose wiring line 23c are electrically connected to each other. As a result, as represented in FIG. 11, the setting positions as to the fixed portion-purpose pad 24d, and the movable portion-purpose pad (not shown) can be located on the diaphragm 31. As a consequently, while the operation and effects similar to those of the first embodiment may be achieved, the pressure sensor-purpose pad 34, the fixed portion-purpose pad 24d, and the movable portion-purpose pad can be formed on the diaphragm 31. In addition, if gold balls, solder balls, and the like are formed on the pad portions over this pressure sensor, then connection pads for so-called "ball bonding" may be alternatively formed.

Fifth Embodiment

Figure 12:
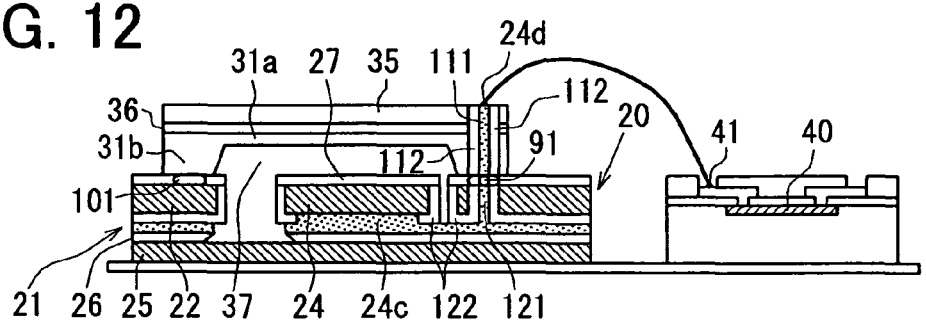
FIG. 12 is a diagram for showing a composite type dynamic amount sensor which indicates a fifth embodiment.

Referring now to FIG. 12, a description is made of a composite type dynamic amount sensor 1 according to a fifth embodiment. The fifth embodiment has the below-mentioned technical different points from those of the fourth embodiment. That is, in this embodiment, while a fixed portion-purpose wiring line 24c and a movable portion-purpose wiring line 23c have been provided on an insulating film 26, the fixed portion-purpose wiring line 24c and the movable portion-purpose wiring line 23c have been connected via a poly-silicon film 121 to the penetration electrodes 111. It should be understood that the same reference numerals shown in the above-described respective embodiments will be employed as those for denoting the same, or similar structural elements in the fifth embodiment, and descriptions thereof are omitted.

FIG. 12 is a sectional view for showing the composite type dynamic amount sensor 1 according to the fifth embodiment, and corresponds to FIG. 1C in the first embodiment.

As indicated in FIG. 12, the coupling portion 24b of the fixed portion 24 has been connected to the fixed portion-purpose wiring line 24c on the side of the supporting substrate 25. Then, a surface except for the coupling portion 24b of the fixed portion 24 has been covered by the insulating film 27 such as $SiO_2$. Also, the fixed portion-purpose wiring line 24c has been electrically connected to the poly-silicon film 121 provided on the outer frame 22, and has been insulated from the outer frame 22 and the movable portion 23 by an insulating film 122. Also, this poly-silicon film 121 has been insulated from the outer frame 22 by the insulating film 122. Similar to the above-described fourth embodiment, the poly-silicon film 121 has been connected by the conducting-purpose solder 91 to the penetration electrodes 111 formed on the ground frame 31b of the diaphragm 31. The fixed portion-purpose pad 24d has been provided on a terminal portion of this penetration electrode 111, which is not connected to the poly-silicon film 121. Then, this fixed portion-purpose pad 24d is connected to the processing circuit-purpose pad 41 of the processing circuit 40 by a wire bonding.

Also, with respect to a movable portion (not shown), a supporting substrate side of the pillar has been connected to the movable portion-purpose wiring line 23c, and furthermore, this movable portion-purpose wiring line 23c has been electrically connected to the poly-silicon film 121 formed on the outer frame 22. This movable portion-purpose wiring line 23c has been insulated from the outer frame 22 and the fixed portion 24 by the insulating film 122. Further, the poly-silicon film 121 has been connected by the conducting-purpose solder 91 to the penetration electrodes 111 formed on the ground frame 31b of the diaphragm 31. The movable portion-purpose pad has been provided on a terminal portion of this penetration electrode 111. Then, this movable portion-purpose pad is connected to the processing circuit-purpose pad 41 of the processing circuit 40 by a wire bonding. Also, the movable electrode, the beam, and the weight have gaps with respect to the insulating film 26, and can be displaced along the elongation direction of the supporting substrate 25 similar to the first embodiment.

It should also be noted that as to a step for forming both the fixed portion-purpose wiring line 24c and the movable portion-purpose wiring line 23c between the fixed portion 24 and the movable portion 23, and the supporting substrate 25, the manufacturing method described in JP-A-H06-123628 may be employed. With employment of the above-described structure, similar operation and effects to those of the fourth embodiment may be achieved. In addition, since a penetration electrode is formed on the supporting substrate 25 of the acceleration sensor 20 by the same method as that described above, an electrode may be derived from the lower portion of the supporting substrate 25 of the acceleration sensor 20.

Sixth Embodiment

Figure 13:
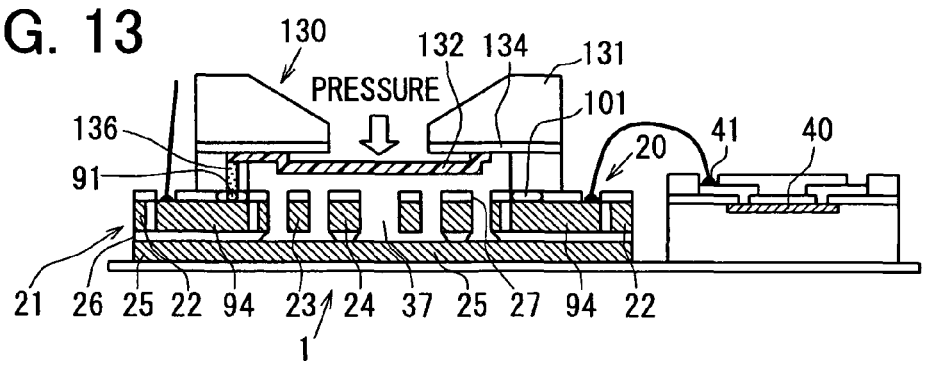
FIG. 13 is a diagram for indicating a composite type dynamic amount sensor which shows a sixth embodiment.

Referring now to FIG. 13, a description is made of a composite type dynamic amount sensor 1 according to a sixth embodiment. The sixth embodiment has the below-mentioned technical different points from those of the third embodiment. That is, in this embodiment, a capacitance type pressure sensor 130 is stacked on the capacitance Type acceleration sensor 20. It should be understood that the same reference numerals shown in the above-described respective embodiments will be employed as those for denoting the same, or similar structural elements in the sixth embodiment, and descriptions thereof are omitted.

FIG. 13 is a sectional view for showing the composite type dynamic amount sensor 1 according to the sixth embodiment, and corresponds to FIG. 1B in the first embodiment.

As represented in FIG. 13, the capacitance type pressure sensor 130 is constituted by a base portion 131, a lower electrode 132, an insulating film 134, and a lower electrode pierced wiring line 136. The base portion 131 is provided with an opening portion having a tapered form at a center. The lower electrode 132 corresponds to a circular-shaped diaphragm 31 which is deformed when pressure is applied, while the lower electrode 132 covers the opening portion of the base portion 131. The insulating film 134 insulates the lower electrode 132 from the base portion 131. The lower electrode pierced wiring line 136 is pierced in the base portion 131 and is connected to the lower electrode 132. Although not shown in the drawing, the lower electrode pierced wiring line 136 has been insulated from the base portion 131.

Also, a switch circuit for switching an applied signal (voltage, or current) has been connected to the lower electrode 132 and the movable portion 23 and the fixed portion 24 of the capacitance type acceleration sensor 20. Since this switch current is employed, a first time and a second time are set in a periodic manner. In the first time, signals different from each other are inputted to the movable portion 23 and the fixed portion 24, whereas no signal is inputted to the lower electrode 132. In the second time, the same signals are inputted to the movable portion 23 and the fixed portion 24, and a signal is inputted to the lower electrode 132.

In synchronism with this time period, an A/D converting circuit (not shown) switches input ports so as to acquire a potential difference (current difference) between the movable portion 23 and the fixed portion 24 in the first time, and also to acquire a potential difference (current difference) between the lower electrode 132, and both the movable portion 23 and the fixed portion 24 in the second time.

Generally speaking, since an A/D converter and a D/A converter are operated in response to the same timer pulse, an input port for acquiring an output signal is synchronized with an output port for outputting an applied signal, so that the input port and the output port may be switched.

Since such a structure is equipped with the composite type dynamic amount sensor 1, acceleration may be calculated based upon a change in electrostatic capacitances between the movable portion 23 and the fixed portion 24 in the first time. On the other hand, pressure applied to the lower electrode 132 may be calculated based upon an electrostatic capacitance between the movable portion 23 and the fixed portion 24, and the lower electrode 132 in the second time.

Seventh Embodiment

Figure 14:
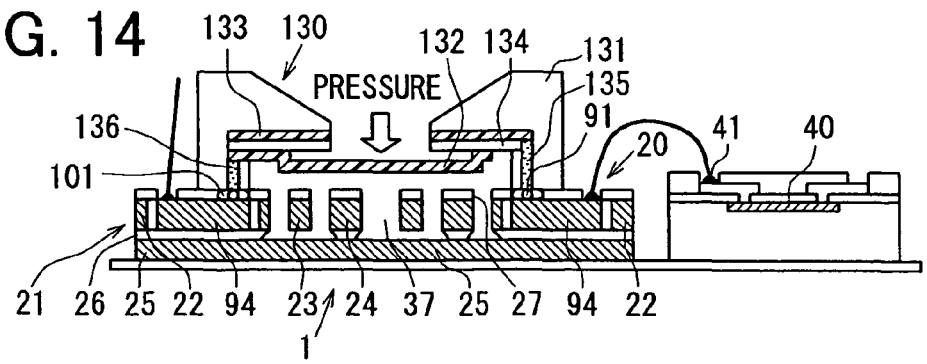
FIG. 14 is a diagram for showing a composite type dynamic amount sensor which indicates a seventh embodiment.

Referring now to FIG. 14, a description is made of a composite type dynamic amount sensor 1 according to a seventh embodiment. The seventh embodiment has the below-mentioned technical different points from those of the sixth embodiment. That is, in this embodiment, the capacitance type pressure sensor 130 is equipped with an upper electrode. It should be understood that the same reference numerals shown in the above-described respective embodiments will be employed as those for denoting the same, or similar structural elements in the seventh embodiment, and descriptions thereof are omitted.

FIG. 14 is a sectional view for showing the composite type dynamic amount sensor 1 according to the seventh embodiment, and corresponds to FIG. 1B in the first embodiment.

As represented in FIG. 14, the capacitance type pressure sensor 130 is constituted by a base portion 131, a lower electrode 132, an upper electrode 133, an insulating film 134, an upper electrode pierced wiring line 135, and also a lower electrode pieced wiring line 136. The base portion 131 is provided with an opening portion having a tapered form at a center. The lower electrode 132 corresponds to a circular-shaped diaphragm 31 which is deformed when pressure is applied, while the lower electrode 132 covers the opening portion of the base portion 131. The upper electrode 133 has an annular shape which is not deformed by pressure, and is provided within the base portion 131 in such a manner that this upper electrode 133 is located opposite to the lower electrode 132. The insulating film 134 insulates both the upper electrode 133 and the lower electrode 132. The upper electrode pierced wiring line 135 is pierced in the base portion 131, and is connected to the upper electrode 133. The lower electrode pierced wiring line 136 is pierced in the base portion 131, and is connected to the lower electrode 132. It should also be noted that although not shown, the lower electrode 132 and the lower electrode pierced wiring line 136 have been insulated from the base portion 131, the upper electrode 133 and the upper electrode pierced wiring line 135 connected to the upper electrode 133. The lower electrode pierced wiring line 136 is connected to the lower electrode 132.

Also, the respective pierced wiring lines 135 and 136 have been connected via the conducting-purpose solder 91 to the pressure sensor-purpose wiring lines 94 respectively provided on a portion of the outer frame 22. Also, similar to the structure of the third embodiment in which the NCF 101 has been sandwiched between the ground frame 31 and the outer frame 22, the NCF 101 has been sandwiched between the base portion 131 and the outer frame 22 even in this embodiment.

Next, a description is made of effects achieved in the seventh embodiment. When positive pressure is applied to the opening portion of the base portion 131, the lower electrode 132 corresponding to the diaphragm 31 is deformed, so that a distance between the lower electrode 132 and the upper electrode 133 is separated. At this time, since either the voltage or the current is applied between the upper electrode 133 and the lower electrode 132, the distance between the upper and lower electrodes 133 and 132 is separated, so that the electrostatic capacitance between these lower and upper electrodes 132 and 133 is decreased. Also, at this time, since such a sealing space has been formed by the lower electrode 132, the capacitance type acceleration sensor 20 (concretely speaking, both outer frame 22 and insulating film 134), and the NCF 101, this sealing space may constitute the reference pressure chamber 37 so as to improve the detection precision of the capacitance type pressure sensor 130.

As previously explained, even in such a case that the capacitance type pressure sensor 130 is employed, similar operation and effects to those of the third embodiment may be achieved.

Eighth Embodiment

Figure 15A:
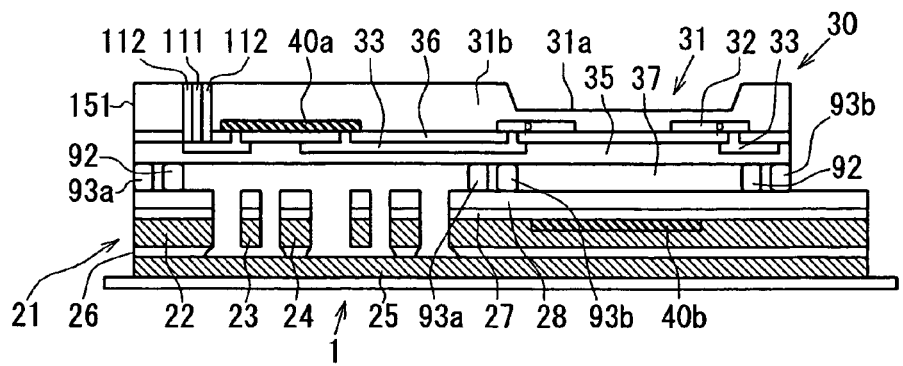
FIGS. 15A and 15B are sectional views for indicating a composite type dynamic amount sensor which shows an eighth embodiment.
Figure 15B:
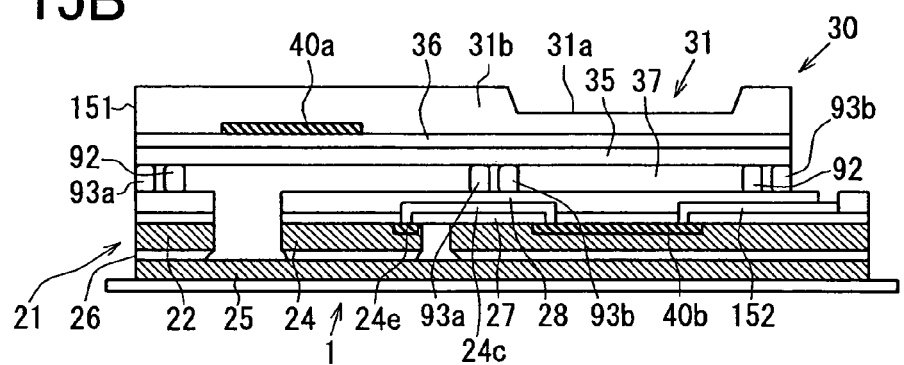

Referring now to FIG. 15A and FIG. 15B, a description is made of a composite type dynamic amount sensor 1 according to an eighth embodiment. The eighth embodiment has the below-mentioned technical different points from those of the respective embodiments described above. That is, in this embodiment, a pressure sensor processing circuit 40a of a piezoelectric type pressure sensor 30 has been provided on a pressure sensor substrate 151 of the piezoelectric type pressure sensor 30; and an acceleration sensor processing circuit 40b has been provided on an outer frame of a capacitance type acceleration sensor 20. It should be understood that the same reference numerals shown in the above-described respective embodiments will be employed as those for denoting the same, or similar structural elements in the eighth embodiment, and descriptions thereof are omitted.

FIG. 15A is a sectional view for showing the composite type dynamic amount sensor 1 according to the eighth embodiment, and corresponds to FIG. 1B in the first embodiment; and FIG. 15B corresponds to FIG. 1C in the first embodiment.

The piezoelectric type pressure sensor 30 will now be described with reference to FIG. 15A. The piezoelectric type pressure sensor 30 is constituted by a diaphragm 31, a piezoelectric resistor 32, a pressure sensor-purpose wiring line 33, a pressure sensor processing circuit 40a, and a penetration electrode 111. The diaphragm 31 has been formed by removing a portion of a pressure sensor substrate 151. The piezoelectric resistor 32 has been provided on the diaphragm 31. The pressure sensor-purpose wiring line 33 is connected to the piezoelectric resistor 32 and the pressure sensor processing circuit 40a. The pressure sensor processing circuit 40a has been formed within the pressure sensor substrate 151 and processes a signal of the pressure sensor-purpose wiring line 33. The penetration electrode 111 transfers a processed signal of the pressure sensor processing circuit 40a over the pressure sensor substrate 151. It should also be noted that the pressure sensor processing circuit 40a has been formed on an opposite plane of the diaphragm 31 on the opening side in the pressure sensor substrate 151. The pressure sensor-purpose wiring line 33 has been connected to an input terminal of the pressure sensor processing circuit 40a. Also, an output terminal of the pressure sensor processing circuit 40a has been connected to the penetration electrode 111. It should also be understood that this penetration electrode 111 has been insulated from the pressure sensor substrate 151 by the insulating film 112.

Referring now to FIG. 15A and FIG. 15B, the capacitance type acceleration sensor 20 will be described. When the piezoelectric type pressure sensor 30 is stacked on the capacitance type acceleration sensor 20, in the outer frame 22, the acceleration sensor processing circuit 40b has been formed at a place located opposite to the diaphragm 31. Also, both the fixed portion-purpose wiring line 24c and the movable portion-purpose wiring line 23c have been connected to an input terminal of the acceleration sensor processing circuit 40b, whereas an acceleration sensor output wiring line 152 has been connected to an output terminal thereof. This acceleration sensor output wiring line 152 implies such a wiring line which outputs a result obtained by the acceleration sensor processing circuit 40b for processing signals entered from the fixed portion-purpose wiring line 24c and the movable portion-purpose wiring line 23c. As this acceleration sensor output wiring line 152, such a portion which is not covered by the pressure sensor substrate 151 is exposed from the oxide film 28 to become a pad.

Also, as shown in FIG. 15A and FIG. 15B, the piezoelectric type pressure sensor 30 has been coupled to the capacitance type acceleration sensor 20 by the coupling-purpose solder 92 under such a condition that these sensors 30 and 20 depress a first air tight ring 93a and a second air tight ring 93b so as to sandwich therebetween these rings 93a and 93b. In other words, both the movable portion 23 and the fixed portion 24 are sealed within the sealing space by the first air tight ring 93a. Furthermore, the reference pressure chamber 37 is formed by the second air tight ring 93b, the diaphragm 31, and the insulating film 28.

Since the above-explained structure is employed in the composite type dynamic amount sensor 1, while similar operation and effects to these of the first embodiment may be achieved, the processing circuits 40a and 40b can be sealed, so that processing circuits 40a and 40b can be protected.

Ninth Embodiment

Figure 16:
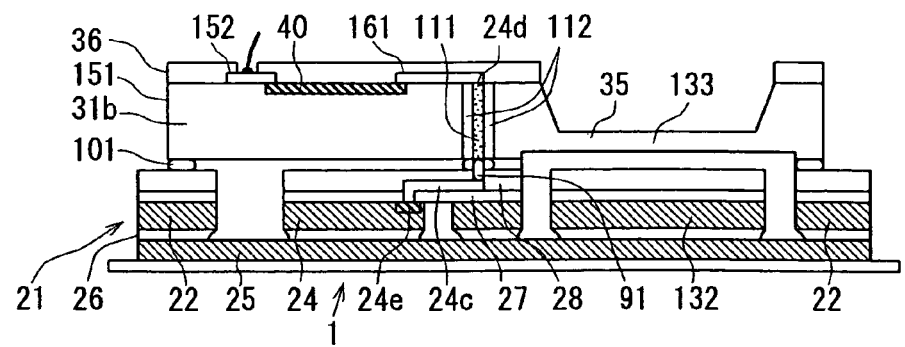
FIG. 16 is a sectional view for showing a composite type dynamic amount sensor which indicates a ninth embodiment.

Referring now to FIG. 16, a description is made of a composite type dynamic amount sensor 1 according to a ninth embodiment. The ninth embodiment has the below-mentioned technical different points from those of the eighth embodiment. That is, in this embodiment, a sensor which senses pressure corresponds to a capacitance type pressure sensor. It should be understood that the same reference numerals shown in the above-described respective embodiments will be employed as those for denoting the same, or similar structural elements in the ninth embodiment, and descriptions thereof are omitted.

FIG. 16 is a sectional view for showing the composite type dynamic amount sensor 1 according to the ninth embodiment, and corresponds to FIG. 15B in the eighth embodiment.

As indicated in FIG. 16, the capacitance type pressure sensor is constituted by an upper electrode 133 provided on a diaphragm 35, and a lower electrode 132 which is located opposite to the upper electrode 133 and is upwardly formed on a supporting substrate via an insulating film 26. Then, an output signal of the upper electrode 133 and an output signal of the lower electrode 132 are inputted to the processing circuit 40 via wiring lines (not shown, for example, penetration electrodes). The processing circuit 40 compares the output signal of the upper electrode 133 with the output signal of the lower electrode 132 so as to detect an electrostatic capacitance between the upper electrode 133 and the lower electrode 132, and then, calculates pressure applied to the diaphragm 35 based upon a change amount of the detected electrostatic capacitances. It should also be noted that as the lower electrode 132 of this embodiment, this lower electrode 132 is not formed by being substituted by the movable portion 23 and the fixed portion 24 as shown in FIG. 13, but a single silicon member having a rectangular shape may be employed.

On the other hand, the capacitance type acceleration sensor 20 is made of a substantially same structure as that of the above-described capacitance type acceleration sensor 20 of FIG. 11. However, although the penetration electrode 111 which transfers the output signal of the capacitance type acceleration sensor 20 has been provided on the diaphragm 31 in FIG. 11, the penetration electrode 111 has been provided on a place of the pressure sensor substrate 151, which is not the diaphragm 35 in this embodiment. Then, in the pressure sensor substrate 151, the processing circuit 40 has been provided on an edge plane of this substrate 151, which is located opposite to the side of the supporting substrate. As indicated in FIG. 16, an output signal of the fixed portion 24 is entered via the penetration electrode 111 and the wiring line 161 to the processing circuit 40, and furthermore, an output signal of a movable portion (not shown), and also output signals of the lower electrode 132 and the upper electrode 133 are entered to this processing circuit 40. The processing circuit 40 further executes an amplifying process and a calculating process based upon these input signals in order to output calculation results by employing an acceleration sensor output wiring line 152 and another wiring line (not shown). As shown in the acceleration sensor output wiring line 152 of FIG. 16, pads have been provided on edge portions of these wiring lines.

Since the above-described structure is constructed in the composite type dynamic amount sensor 1, even when such a capacitance type pressure sensor is employed, similar operation and effects as those of the above-described eighth embodiment can be achieved.

It should also be understood that although the lower electrode 132 is made of the electrode having the plate-shaped member in the ninth embodiment, such a structure may be alternatively employed instead of the lower electrode 132 that both the fixed portion and the movable portion of FIG. 13 are located opposite to the upper electrode 133. In this alternative case, it is so assumed that while the capacitance type acceleration sensor 20 located opposite to the processing circuit 40 is defined as a first acceleration sensor, and both the fixed portion and the movable portion are defined as a second acceleration sensor, which are located opposite to the upper electrode 133 and are substituted as the lower electrode; and both a detecting direction (displace direction of movable portion) of the first accelerator sensor and a detecting direction of the second acceleration sensor are made different from each other (for instance, orthogonal direction). At this time, similar to the sixth embodiment, timing (first time) for detecting acceleration and timing (second time) for detecting pressure are set to both the fixed portion and the movable portion of the second acceleration sensor in a periodic manner. As a result, acceleration may be detected by the second acceleration sensor in the first time, whereas pressure may be detected by the second acceleration sensor and the upper electrode 133 in the second time.

Since the above-described alternative structure is constructed, the acceleration of the 2 axes may be detected by the first acceleration sensor and the second acceleration sensor, and further, the pressure may be detected by employing the fixed portion and the movable portion of the second acceleration sensor, and the upper electrode 133.

Tenth Embodiment

Figure 17:
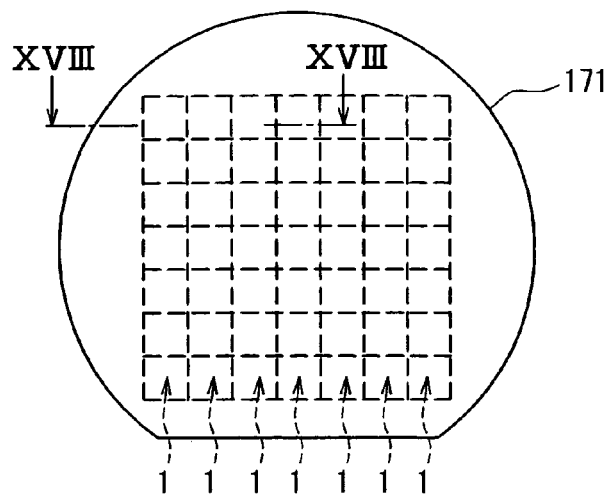
FIG. 17 is a diagram for illustratively showing a wafer substrate on which a plurality of composite type dynamic amount sensors have been integrated, which is represented in a tenth embodiment.
Figure 18:
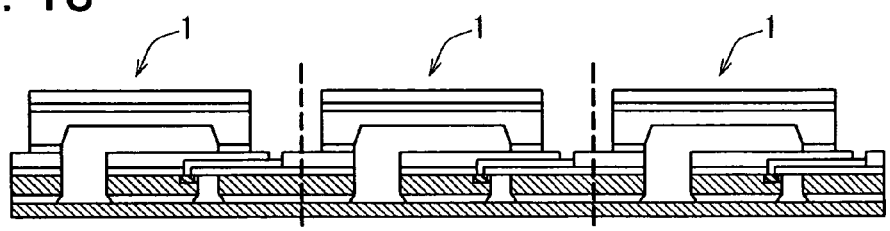
FIG. 18 is a sectional view of the wafer substrate taken along a line XVIII-XVIII of FIG. 17.

Referring now to FIG. 17 and FIG. 18, a description is made of a composite type dynamic amount sensor 1 according to a tenth embodiment. This embodiment is such an embodiment that a plurality of the above-explained composite type dynamic amount sensors 1 of the first embodiment are manufactured at the same time by employing a semiconductor process. It should be understood that the same reference numerals shown in the above-described respective embodiments will be employed as those for denoting the same, or similar structural elements in the tenth embodiment, and descriptions thereof are omitted.

FIG. 17 is a bird's eye view for representing a wafer substrate 171 in which a plurality of the above-described composite type dynamic amount sensors 1 of the first embodiment shown in FIG. 1A to FIG. 1C have been integrated. Furthermore, FIG. 18 is an enlarged sectional view of the wafer substrate 171, taken along a line XVIII-XVIII in FIG. 17. As represented in FIG. 18, the piezoelectric type pressure sensors 30 of FIG. 1A to FIG. 1C are stacked on each other in order to correspond to the respective capacitance type acceleration sensors 20 of the acceleration sensor-sided wafer substrate where the plural pieces of capacitance type acceleration sensor 20 of FIG. 1A to FIG. 1C are stacked. As a result, such a wafer substrate 171 that the plural pieces of composite type dynamic amount sensors 1 shown in FIG. 17 have been stacked is formed. Then, this wafer substrate 171 is dicing-cut along dot lines shown in FIG. 17 and FIG. 18, so that a plurality of the composite type dynamic amount sensors 1 of FIG. 1A to FIG. 1C can be obtained.

Under such a condition that the piezoelectric type pressure sensors 30 have been stacked on the capacitance type acceleration sensors 20, the fixed portion-purpose pads 24d and the movable portion-purpose pads 23f of the capacitance type acceleration sensors 20 are exposed, so that an energizing test may be carried out before the wafer substrate 171 is dicing-cut. Alternatively, a wafer substrate 1 where a plurality of acceleration sensors have been formed, and another wafer substrate 2 where a plurality of pressure sensors have been formed may be stacked each other under wafer statuses, and thereafter, the stacked wafer substrates may be dicing-cut. In this alternative case, either a penetration groove or a penetration hole has been formed in the wafer substrate 2 on which the pressure sensors of the upper area portion have been formed, which are wired-bonded with the acceleration sensors in order to be equivalent to, for example, FIG. 18, and thereafter, the wafer substrates are stacked on each other.

Eleventh Embodiment

Referring now to FIG. 19A and FIG. 20A to FIG. 20C, a description is made of a composite type dynamic amount sensor 1 according to an eleventh embodiment. The eleventh embodiment has the below-mentioned technical different points from those of the above-described tenth embodiment. That is, in this embodiment, a piezoelectric type pressure sensor 30 which is stacked on an acceleration sensor-sided wafer substrate 171 is stacked under a condition of a pressure sensor-sided wafer substrate 172. It should be understood that the same reference numerals shown in the above-described respective embodiments will be employed as those for denoting the same, or similar structural elements in the eleventh embodiment, and descriptions thereof are omitted.

Figure 19:
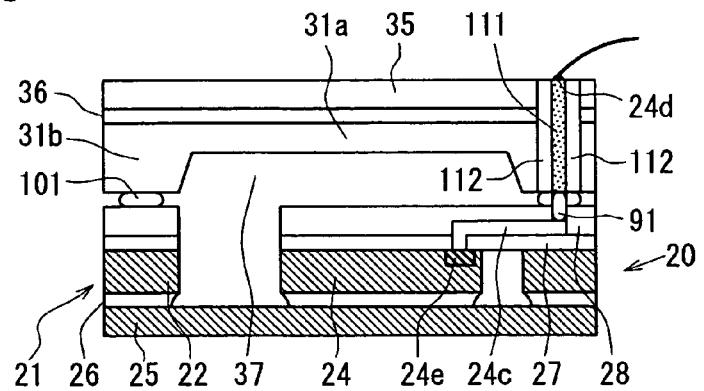
FIG. 19 is a diagram for showing a composite type dynamic amount sensor which indicates an eleventh embodiment.

FIG. 19 is a sectional view for showing the composite type dynamic amount sensor 1 according to the eleventh embodiment. As a structure of the composite type dynamic amount sensor 1, with respect to FIG. 11 of the fourth embodiment, a side plane (namely, plane of direction perpendicular to pressure applied direction) of the ground frame 31b of the piezoelectric type pressure sensor 30 is made coincident with a side plane (namely, plane of acceleration applied direction) of the capacitance type acceleration sensor 20.

Figure 20A:
FIG. 20A to FIG. 20C represent steps for stacking a pressure sensor-sided wafer substrate on an acceleration sensor-sided wafer substrate, which are employed in the eleventh embodiment.
Figure 20B:
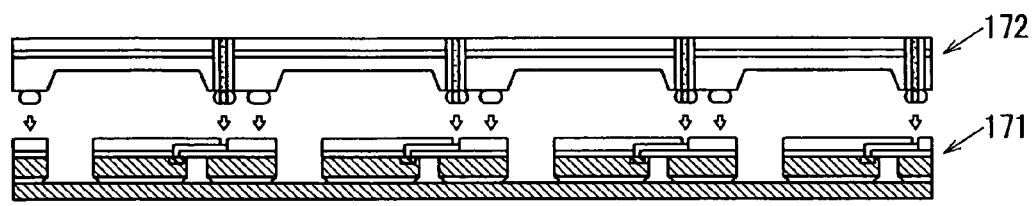
Figure 20C:
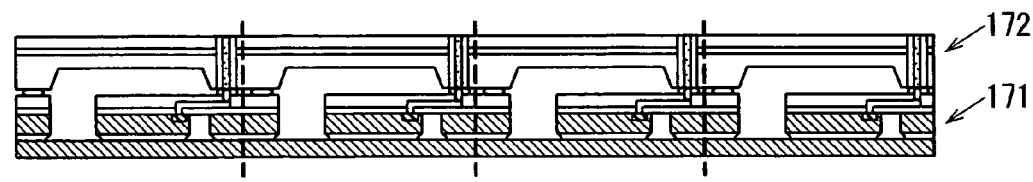

Next, a description is made of a method for manufacturing the composite type dynamic amount sensor 1 of the eleventh embodiment with reference to FIG. 20A to FIG. 20C.

Firstly, as shown in FIG. 20A, such a pressure sensor-sided wafer substrate 172 is prepared in which a plurality of the above-explained piezoelectric type pressure sensors 30 shown in FIG. 19 have been stacked. This pressure sensor-sided wafer substrate 172 is such a pressure sensor-sided wafer substrate into which the piezoelectric resistor 32 and the penetration electrode 111 (which are not shown) have been processed in the above-described forming step in the fourth embodiment and then have already been formed.

In a step of FIG. 20B subsequent to the step of FIG. 20A, after the conducting-purpose solder 91 is set to an exposed portion of the penetration electrode 111 of the pressure sensor-sided wafer substrate 172, and the NCF 101 is set to a predetermined portion, the pressure sensor-sided wafer substrate 172 is stacked with respect to the acceleration sensor-sided wafer substrate 171.

In a step of FIG. 20C subsequent to the step of FIG. 20B, the stacked substrate manufactured in FIG. 20B is dicing-cut along dot lines, so that such a composite type dynamic amount sensor 1 of FIG. 19 can be obtained.

In the eleventh embodiment, after the pressure sensor-sided wafer substrate 172 and the acceleration sensor-sided wafer substrate 171 have been stacked to each other, the stacked wafer substrate is dicing-cut. As a result, in accordance with the manufacturing method of the eleventh embodiment, total numbers of the dicing-cut process and of the stacking process are smaller than those of the below-mentioned case: That is, the pressure sensor-sided wafer substrate 172 is dicing-cut to form the piezoelectric type pressure sensor 30, and further, the acceleration sensor-sided wafer substrate 171 is dicing-cut to form the capacitance type acceleration sensor 1, and then, these sensors 172 and 171 are separately stacked to each other.

On the other hand, in the present embodiment, the composite type dynamic amount sensor 1 having the substantially same structure as that of the above-described fourth embodiment shown in FIG. 11 has been manufactured by stacking the pressure sensor-sided wafer substrate 172 on the acceleration sensor-sided wafer substrate 171. However, a structure of a composite type dynamic amount sensor manufactured by a stacking manner is not limited only to that shown in FIG. 11. For example, as represented in FIG. 1A to FIG. 1C of the first embodiment, even when the piezoelectric type pressure sensor 30 is employed which has the pressure sensor-purpose pad 34 on the plane of the ground frame 31b of the deforming portion 31a, which is located opposite to the concave bottom plane, such a pressure sensor-sided wafer substrate on which the above-described piezoelectric type pressure sensor 30 has been integrated is prepared. Then, this pressure sensor-sided wafer substrate may be stacked on an acceleration sensor-sided wafer substrate. In this alternative case, it is preferable to form a penetration hole in the pressure sensor-sided wafer substrate before the piezoelectric type pressure sensor 30 is stacked in order that the fixed portion-purpose pad is not covered by the ground frame 31b of the piezoelectric type pressure sensor 30.

Figure 35:
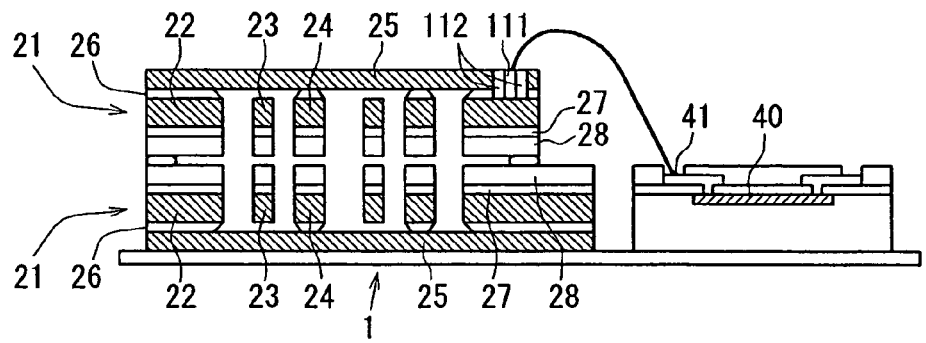
FIG. 35 is a sectional view for showing a composite type dynamic amount sensor represented in a modification of embodiments.

In addition to the structure shown in FIG. 1A to FIG. 1C, even in the structure of FIG. 9A to FIG. 9C, the structure of FIG. 10A to FIG. 10C, the structure of FIG. 11, and the structure of FIG. 12, the pressure sensor-sided wafer substrates may be stacked on the acceleration sensor-sided wafer substrates, and then, the stacked wafer substrates may be dicing-cut. Also, in the structure of FIG. 35, the first acceleration sensor-sided wafer substrate may be stacked on the second acceleration sensor-sided wafer substrate, and then, the stacked wafer substrate may be dicing-cut.

Twelfth Embodiment

Referring now to FIG. 21, FIG. 22A to FIG. 22B, and FIG. 23A to FIG. 23F, a description is made of a stacked layer type dynamic amount sensor 201 according to a twelfth embodiment. The twelfth embodiment has the below-mentioned technical different points from those of the first embodiment. That is, in this embodiment, a piezoelectric type pressure sensor 30 has been stacked on a circuit board 240. It should be understood that the same reference numerals shown in the above-described respective embodiments will be employed as those for denoting the same, or similar structural elements in the twelfth embodiment, and descriptions thereof are omitted.

Figure 21:
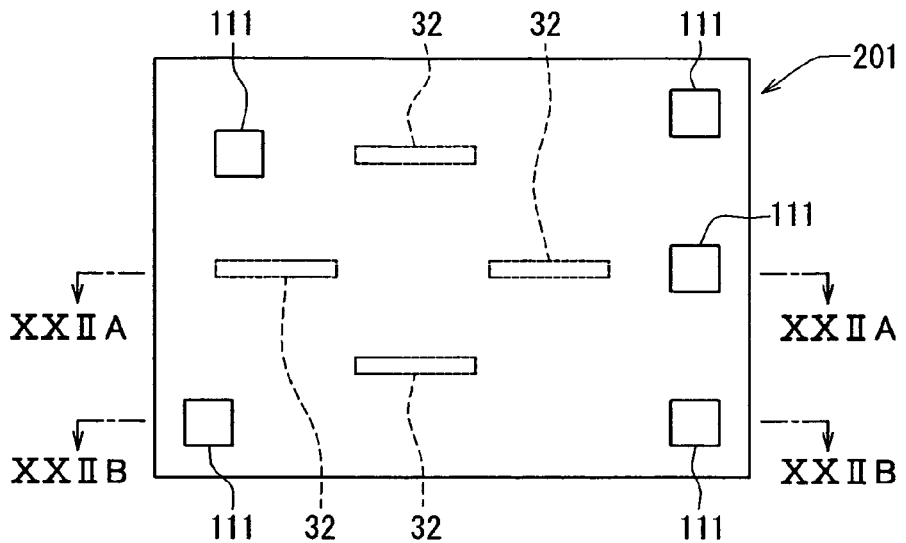
FIG. 21 is a plan view for indicating a stacked layer type dynamic amount sensor which represents a twelfth embodiment.

FIG. 21 is a plan view for showing the stacked layer type dynamic amount sensor 201 according to the twelfth embodiment. In FIG. 21, although piezoelectric resistors 32 are not exposed from a surface of the stacked layer type dynamic amount sensor 201, setting positions are indicated by using dot lines, for the sake of explanations. The penetration electrodes 111 exposed in FIG. 21 are employed so as to supply electric power for driving the processing circuit 40 and the piezoelectric type pressure sensor 30, and are used as the ground, and also are employed to derive output signals from the processing circuit 40 and the piezoelectric type pressure sensor 30. A sectional view, taken along a line XXIIA-XXIIA of FIG. 21 is shown in FIG. 22A, and another sectional view, taken along a line XXIIB-XXIIB of FIG. 21 is indicated in FIG. 22B.

Figure 22A:
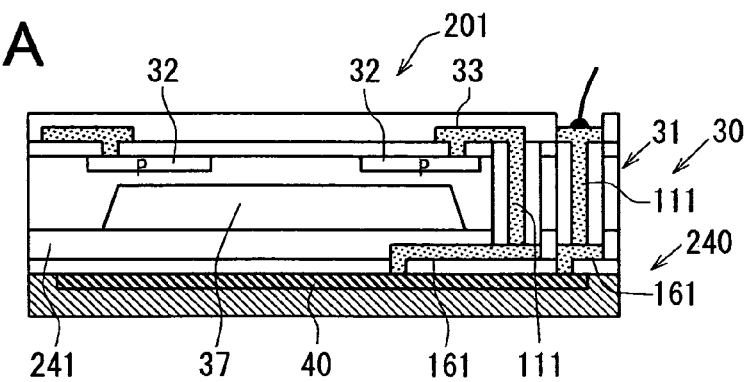
FIG. 22A to FIG. 22B are diagrams of a stacked layer type dynamic amount sensor used in the twelfth embodiment.
Figure 22B:
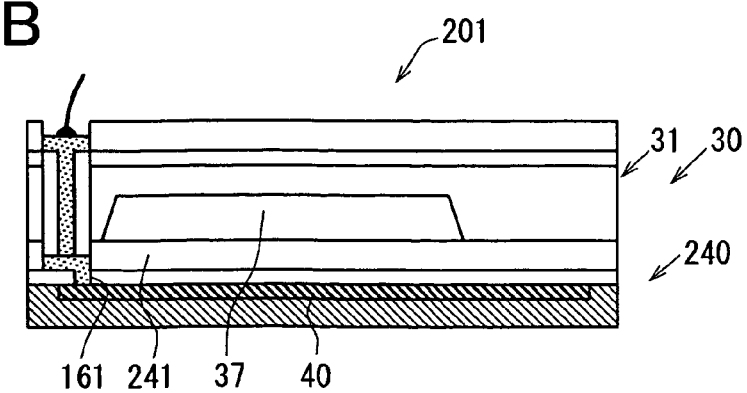

As indicated in FIG. 22A, the stacked layer type dynamic amount sensor 201 has such a structure that the piezoelectric type pressure sensor 30 has been stacked on the circuit board 240. An output signal of the piezoelectric type pressure sensor 30 is entered via the penetration electrode 111 and a wiring line 161 to the processing circuit 40 of the circuit board 24, and thus, is processed in this processing circuit 40. Then, a signal processed result of the processing circuit 40 is derived from a surface of the diaphragm 31 by the processing circuit 40 and the penetration electrode 111 which penetrates the surface of the diaphragm 31. Also, the reference pressure chamber 37 of the piezoelectric type pressure sensor 30 is realized by diverting a space which is formed between a surface protection film 241 of the circuit board 240 and the diaphragm 31. Also, as indicated in FIG. 22B, another penetration electrode 111 for supply the drive power to the processing circuit 40 has been provided.

Referring now to FIG. 23A to FIG. 23F, a description is made of a method for manufacturing the stacked layer type dynamic amount sensor 201 according to this embodiment.

Figure 23A:
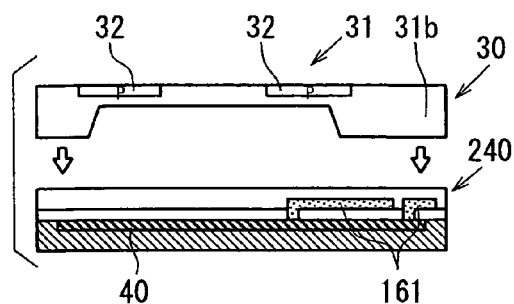
FIG. 23A to FIG. 23F are diagram for showing manufacturing steps of the stacked layer type dynamic amount sensor of FIG. 22A, which is provided in the twelfth embodiment.

Firstly, as shown in FIG. 23A, the diaphragm 31 into which the piezoelectric resistors 32 have been internally formed, and the circuit board 240 are prepared, and then are adhered to each other. In the circuit board 240, the processing circuit 40 and the wiring line 161 made of aluminum are provided on a silicon substrate. As one example as to the adhering methods, both the diaphragm 31 and the circuit board 240 may be surface-processed in a vacuum atmosphere, and may be joined to each other by a surface activating method (direct joining at room temperature). If the direct joining method at the room temperature is conducted, then the following merit may be obtained: That is, the diaphragm 31 can be joined to the circuit board 240 at a temperature lower than a melting point of aluminum which constitutes the wiring line 161. Alternatively, an anode joining method and a glass joining method using low melting point glass may be employed.

In a step of FIG. 23B subsequent to FIG. 23A, a photoresist mask forming operation and a reactive ion etching process (will be referred to as "RIE" process hereinafter) are carried out with respect to the insulating film 36 formed on the piezoelectric resistors 32 of the diaphragm 31 so as to form a contact hole 243 in the ground frame 31b. This RIE process is performed until the wiring line 161 of the circuit board 240 is exposed. In other words, since the wiring line 161 is made of aluminum, this wiring line 161 may function as a stopper when the RIE process is performed.

Figure 23D:
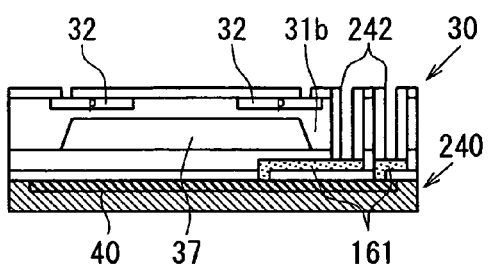
Figure 23B:
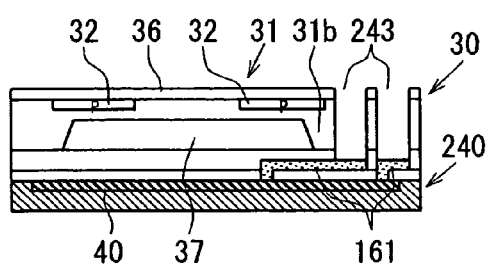
Figure 23E:
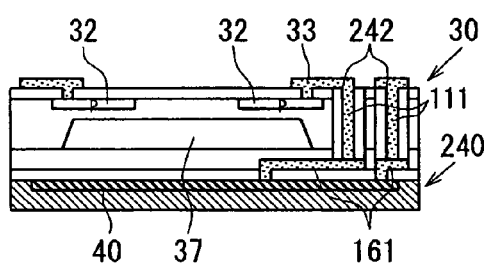
Figure 23C:
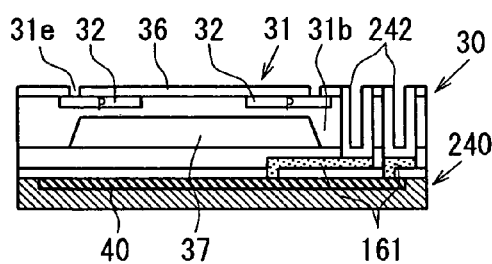
Figure 23F:
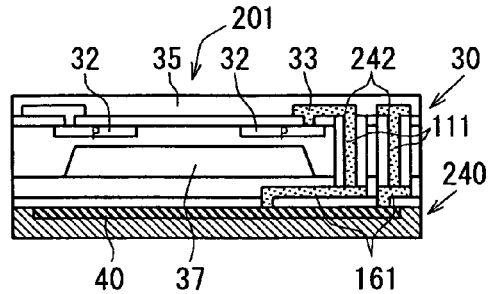

In a step of FIG. 23C subsequent to FIG. 23B, an oxide film ($SiO_2$) 242 is deposited by way of a CVD (chemical vapor deposition) method on the wall plane of the contact hole 243. At this time, the oxide film 242 is also deposited even on the wiring line 161 on the bottom plane of the contact hole 243.

In a step of FIG. 23D subsequent to FIG. 23C, the RIE process is further performed so as to expose the wiring line 161, and also to form a contact hole 31e in a portion of the insulating film 36 which covers the piezoelectric resistors 32.

In a step of FIG. 23E subsequent to FIG. 23D, aluminum is deposited by the CVD method on the contact hole 243 and the contact hole 31e formed in the oxide film 36 which covers the piezoelectric resistors 32. At this time, aluminum is also deposited on a space between a portion of the contact hole 243 and the contact hole 31e formed in the oxide film 36 in order to electrically connect these contact holes 243 and 31e to each other, so that a pressure sensor-purpose wiring line 33 is formed. It should also be noted that a substance to be deposited is not limited only to aluminum, but may be selected from other metals such as tungsten, and poly-silicon. In a step of FIG. 23F subsequent to FIG. 23E, the surface protection film 35 is deposited in such a manner that this surface protection film 35 covers the pressure sensor-purpose wiring line 33 formed in the preceding step of FIG. 23E. Thereafter, the RIE process is carried out in order to provide a contact hole in the surface protection film 35, so that such a stacked layer type dynamic amount sensor 201 as shown in FIG. 21 and FIG. 22A to FIG. 22B is accomplished. This contact hole is formed in order to derive a signal of the processing circuit 40 outside this sensor 201.

Next, a description is made of effects achieved by the stacked layer type dynamic amount sensor 201 of the twelfth embodiment. As a first effect, since the piezoelectric type pressure sensor 30 is stacked on the circuit board 240, the area occupied by the sensor can be reduced, as compared with such a structure that a piezoelectric type pressure sensor and a circuit board are separately provided.

Also, as a second effect, the penetration electrodes 111 are provided on the ground frame 31b for supporting the diaphragm 31 so as to connect the piezoelectric resistors 32 to the processing circuit 40, so that higher reliability can be achieved, as compared with such a structure that the piezoelectric resistor 32 and the processing circuit 40 are not stacked, but are electrically connected to each other by using wires.

As a third effect, the processing circuit 40 is arranged behind the diaphragm 31 with respect to the pressure applied direction, namely arranged via the reference pressure chamber 37. As a result, the processing circuit 40 can be protected. More specifically, since transistor elements which construct the processing circuit 40 may be readily and adversely influenced by contaminations (for example, contaminations caused by fluid and gas, whose pressure should be detected), it is desirable to arrange that the processing circuit 40 is separated apart from the diaphragm 31 having risks of such contaminations.

It should also be noted that the stacking layer steps need not be carried out in the chip unit as represented in FIG. 23A to FIG. 23F. That is, as explained in the above tenth embodiment, one structural component (for example, piezoelectric type pressure sensor 30) may be subdivided in the chip unit, and thereafter, the divided sensor may be stacked on the other structural component (circuit board 240) under wafer substrate condition. Also, as described in the above eleventh embodiment, both the structural components (namely, piezoelectric type pressure sensor 30 and circuit board 240) may be alternatively stacked to each other under wafer substrate condition.

Thirteenth Embodiment

Figure 24:
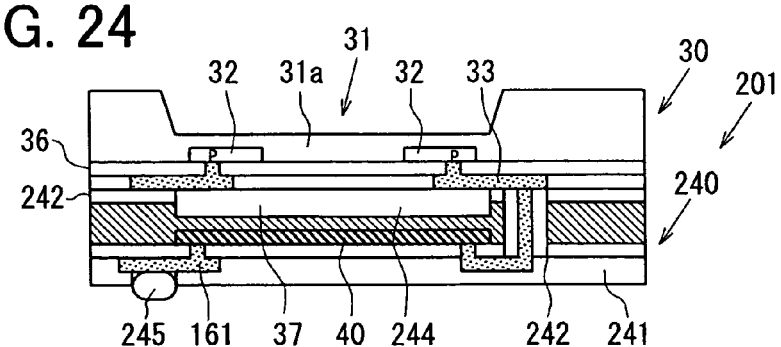
FIG. 24 is a diagram for showing a stacked layer type dynamic amount sensor, which indicates a thirteenth embodiment.

Referring now to FIG. 24, a description is made of a stacked layer type dynamic amount sensor 201 according to a thirteenth embodiment. The thirteenth embodiment has the below-mentioned technical different points from those of the twelfth embodiment. That is, in this embodiment a concave portion of a diaphragm 31 of a piezoelectric type pressure sensor 30 is present on the side of a pressure application. It should be understood that the same reference numerals shown in the above-described respective embodiments will be employed as those for denoting the same, or similar structural elements in the thirteenth embodiment, and descriptions thereof are omitted.

FIG. 24 is a sectional view for showing the stacked layer type dynamic amount sensor 201 according to the thirteenth embodiment. As indicated in FIG. 24, the concave portion of the diaphragm 31 of the piezoelectric type pressure sensor 30 is present on the pressure application side. Then, the piezoelectric resistors 32 have been arranged via a silicon layer which constitutes the diaphragm 31 on an inner side of a bottom plane of the concave portion.

Also, a concave 244 has been formed in a place of the circuit board 240, which is located opposite to the deforming portion 31a of the diaphragm 31 in order to become the reference pressure chamber 37 when the piezoelectric type pressure sensor 30 is stacked on the circuit board 240. This concave 244 is formed in such a plane of the silicon substrate, which is located opposite to a plane thereof into which the processing circuit 40 has been formed. Concretely speaking, after the processing circuit 40 has been formed in the silicon substrate, a portion of the oxide film 242 provided on the plane of this silicon substrate is removed, which is located opposite to the plane thereof where the processing circuit 40 has been formed. Furthermore, while the oxide film 242 which has not been removed is employed as a mask, the silicon substrate is etched so as to form the concave 244. Then, with respect to the circuit board 240 under such a condition that the concave 244 has been formed, such a piezoelectric type pressure sensor 30 is stacked by the direct joining process. In this piezoelectric type pressure sensor 30, the piezoelectric resistors 32, the pressure sensor-purpose wiring 33, and the deforming portion 31a have been formed in the silicon substrate. After the direct joining process, the processing circuit 40 is electrically connected to the piezoelectric resistors 32 by utilizing the above-described method for forming the penetration electrodes 111 with reference to FIG. 23A to FIG. 23F, and furthermore, the protection film 241 for protecting the circuit board 240 is provided on the side of the processing circuit 40.

Also, a signal deriving electrode 245 may be formed on the protection film 241 for protecting the processing circuit 40, and this signal driving electrode 245 may be connected by a bump, so that the stacked layer type dynamic amount sensor 201 may be formed as a flip chip.

Effects of this embodiment will now be described. As a first effect, since the sensor 201 is formed in the flip chip, a total number of wiring lines exposed at portions which are exposed to the open air can be decreased (in particular, total number should be preferably decreased to zero). As a second effect, while the concave 244 is formed at the rear plane of the processing circuit 40 where no element is formed, this concave 244 is utilized as the reference pressure chamber 37, so that the capacity of the reference pressure chamber 37 can be secured. As a consequence, in order to secure the capacity of the reference pressure chamber 37, either a spacer or an insulating film is no longer provided between the piezoelectric type pressure sensor 30 and the circuit board 240 (otherwise, may be provided).

Fourteenth Embodiment

Figure 25A:
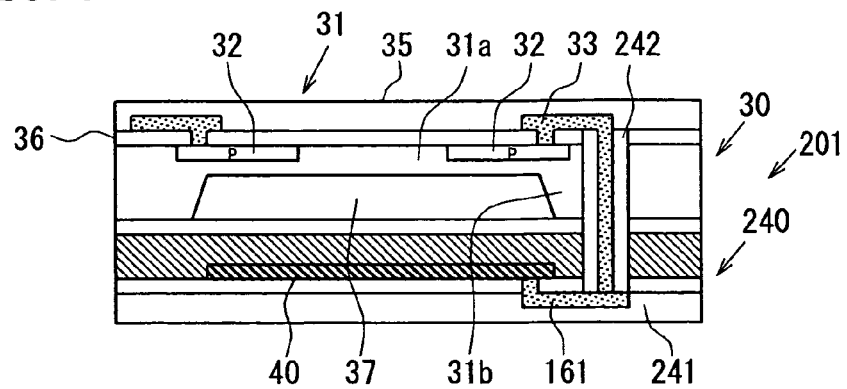
FIG. 25A to FIG. 25B are diagrams for indicating a stacked layer type dynamic amount sensor which shows a fourteenth embodiment.
Figure 25B:
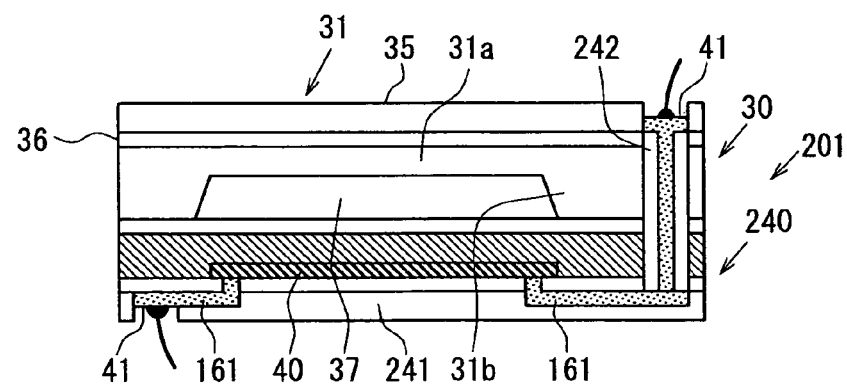

Referring now to FIG. 25A to FIG. 25B, a description is made of a stacked layer type dynamic amount sensor 201 according to a fourteenth embodiment. This embodiment is different from the above-described twelfth embodiment as to the following technical point: That is, the processing circuit 40 has been formed on such a side of the circuit board 240, which is located opposite to the reference pressure chamber 37.

It should be understood that the same reference numerals shown in the above-described respective embodiments will be employed as those for denoting the same, or similar structural elements in the fourteenth embodiment, and descriptions thereof are omitted.

FIG. 25A and FIG. 25B are sectional views for indicating the stacked layer type dynamic amount sensor 201 according to the fourteenth embodiment. Also, FIG. 25A corresponds to FIG. 22A in the twelfth embodiment, and FIG. 25B corresponds to FIG. 22B in the twelfth embodiment. As shown in FIG. 25A and FIG. 25B, the processing circuit 40 has been formed on a plane of the circuit board 240, which is located opposite to the reference pressure chamber 37, namely, has been formed on the plane of this circuit board 240 along a direction opposite to the pressure applied direction of the diaphragm 31.

Firstly, a detailed description is made of FIG. 25A. The pressure sensor-purpose wiring line 33 has been provided within the surface protection film 35 provided on the pressure applied side of the diaphragm 31. The pressure sensor-purpose wiring line 33 electrically connects the piezoelectric resistors 32 to the penetration electrodes 111 within the ground frame 31b. Furthermore, the penetration electrodes 111 have been electrically connected to wiring lines 161 formed inside the protection film 241 which is provided on the surface of the circuit board 240 where the processing circuit 40 is present. Since the wiring lines 161 are set in the above-described manner, the piezoelectric resistors 32 have been electrically connected to the processing circuit 40.

Next, a description is made of FIG. 25B. In FIG. 25B, one wiring line 161 is partially exposed from the protection film 241, and constitutes a processing circuit-purpose pad 41 for a bonding process. This wiring line 161 is different from the wiring line of FIG. 25A, and passes through the inner portion of the protection film 241 provided on the surface of the circuit board 240. Also, the other wiring line 161 which passes through the protection film 241 has been electrically connected to a penetration electrode 111 which is different from that of FIG. 22A and has been provided in the ground frame 31b. Then, an edge portion of this penetration electrode 111 is exposed from the surface protection film 35 provided on the pressure applied side of the diaphragm 31, and then constitutes the processing circuit-purpose pad 41.

Since the above-described structure is employed, in accordance with the stacked layer type dynamic amount sensor 201 of the fourteenth embodiment, the output signals of the processing circuit 40 may be derived not only from the edge plane of the diaphragm 31 on the pressure applied side, but also from the edge plane of the circuit board 240, which is located opposite side from the pressure applied side.

It should be noted that in this embodiment, the stacked layer type dynamic amount sensor 201 has been made of such a structure that the piezoelectric pressure sensor 30 is stacked on the circuit board 240, and the signals are derived from both planes of the stacked elements. However, this structure is merely one example. For instance, in the structure of FIG. 1A to FIG. 1C, if such a penetration electrode which penetrates both the N type silicon substrate 21 and the insulating film 26 is provided on the supporting substrate 25 of the capacitance type acceleration sensor 20, then signals may be inputted and outputted from both the planes of the composite type dynamic amount sensor 1 as explained in this embodiment. In other words, the gist of this embodiment is given as follows: While the penetration electrode is provided, the signals are inputted and outputted from both the planes of either the composite type dynamic amount sensor 1 or the stacked layer type dynamic amount sensor 201. As a consequence, the structure of the sensor 1, or 201 is not limited only to the structures shown in FIG. 22A and FIG. 22B.

Fifteenth Embodiment

Figure 26:
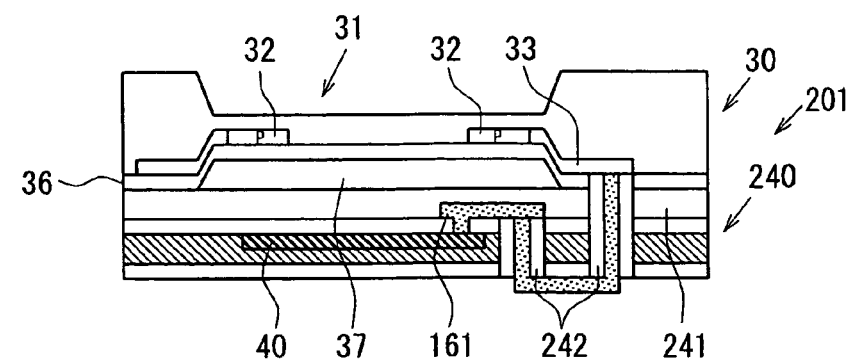
FIG. 26 is a diagram for showing a stacked layer type dynamic amount sensor, which indicates a fifteenth embodiment.

Referring now to FIG. 26, a description is made of a stacked layer type dynamic amount sensor 201 according to a fifteenth embodiment. The fifteenth embodiment has the below-mentioned technical different points from those of the above-described embodiments. That is, in this embodiment, a pressure sensor-purpose wiring line 33 has been formed by an impurity diffusion layer. It should be understood that the same reference numerals shown in the above-described respective embodiments will be employed as those for denoting the same, or similar structural elements in the fifteenth embodiment, and descriptions thereof are omitted.

FIG. 26 is a sectional view for showing the stacked layer type dynamic amount sensor 201 according to the fifteenth embodiment. As shown in FIG. 26, the piezoelectric resistors 32 have been formed on such a plane of the diaphragm 31, which is located opposite to the side thereof to which pressure is applied. Furthermore, an impurity diffusion layer formed by diffusing an impurity into the silicon substrate is located adjacent to the diaphragm 31 in such a manner that this impurity diffusion layer is electrically connected to these piezoelectric registers 32. Then, the pressure sensor-purpose wiring line 33 made of this impurity diffusion layer has been electrically connected via the penetration electrode 111 provided on the circuit board 240 to this circuit board 240.

Also, as shown in FIG. 26, the plane of the circuit board 240, in which the processing circuit 40 has been formed, is faced to the reference pressure chamber 37.

Although not shown in the drawing, a method for manufacturing the above-described stacked layer type dynamic amount sensor 201 will now be described. As a first step, such a piezoelectric type pressure sensor 30 is prepared on which the diaphragm 31, the piezoelectric resistors 32, and the pressure sensor-purpose wiring line 33 made of the impurity diffusion layer have been formed. Also, such a circuit board 240 is prepared which contains the processing circuit 40, the protection film 241 for protecting the processing circuit 40, and the wiring line 161 which is provided within this protection film 241 and is electrically connected to the processing circuit 40.

As a second step, an edge plane of the diaphragm 31 on the side where the pressure sensor-purpose wiring line 33 made of the impurity diffusion layer is present is directly joined to such a plane of the circuit board 240 on the side where the processing circuit 40 is present.

As a third step, a contact hole is formed in such a plane of the circuit board 240 on the side where the processing circuit 40 is not present, while this contact hole is connected to the pressure sensor-purpose wiring line 33 made of the impurity diffusion layer. Furthermore, another contact hole which is connected to the wiring line 161 is formed in the above-described plane of the circuit board 240.

As a fourth step, poly-silicon, or the like is deposited by the CVD method in such a manner that the contact holes formed in the third step are electrically connected to each other. With executions of the above-described steps, the stacked layer type dynamic amount sensor 201 of FIG. 26 can be manufactured.

As an effect achieved by the stacked layer type dynamic amount sensor 201 of the fifteenth embodiment, since not only the processing circuit 40 but also the piezoelectric resistors 32 are present on the side of the reference pressure chamber 27, these processing circuit 40 and piezoelectric resistors 32 can be hardly contacted to the open air. In other words, the environmental resistance characteristic of this stacked layer type dynamic amount sensor 201 can be increased, as compared with such a case that these processing circuit 40 and piezoelectric resistors 32 are exposed to the open air.

Sixteenth Embodiment

Referring now to FIG. 27 and FIG. 28A to FIG. 28E, a description is made of a stacked layer type dynamic amount sensor 201 according to a sixteenth embodiment. The sixteenth embodiment has the below-mentioned technical different points from those of the above-described twelfth embodiment. That is, in this embodiment, the circuit board 240 has been stacked on the capacitance type acceleration sensor 20. It should be understood that the same reference numerals shown in the above-described respective embodiments will be employed as those for denoting the same, or similar structural elements in the sixteenth embodiment, and descriptions thereof are omitted.

Figure 27:
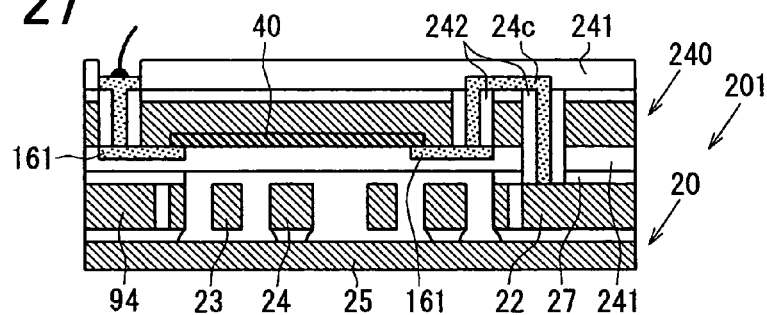
FIG. 27 is a diagram for showing a stacked layer type dynamic amount sensor, which indicates a sixteenth embodiment.

FIG. 27 is a sectional view for showing the stacked layer type dynamic amount sensor 201 according to the sixteenth embodiment. As indicated in FIG. 27, a plane of the circuit board 240 on the side thereof where the processing circuit 40 is present is stacked with respect to such plane of the capacitance type acceleration sensor 20 on the side thereof where the fixed portion 24 and the movable portion 23 are present. Also, an output signal of the fixed portion 24 is once derived via one penetration electrode 111 provided on the circuit board 240 to another plane of the circuit board 240 on the side thereof where the processing circuit 40 is not present. Furthermore, this derived output signal is electrically connected via another penetration electrode 111 to the wiring line 161 present on the plane of the circuit board 240 on the side thereof where the processing circuit 40 is not present. Then, this wiring line 161 has been connected to the input terminal of the processing circuit 40.

As another feature, as represented in FIG. 27, the SiN film 27 is not present on at least the movable portion 23, or the thickness of this SiN film 27 is made thinner, as compared with thickness of the SiN films 27 of the outer frame 22 and the fixed portion 24. As a consequence, the movable portion 23 has a clearance with respect to the circuit board 240, and such a structure which is movable along the same direction as the elongation direction of the supporting substrate 25. On the other hand, in order that the circuit board 240 can be stacked under stable condition, the SiN films 27 are present on either portions or entire portions of the fixed portion 24 and the outer frame 22. In the case shown in FIG. 27, in order to simplify the step for removing the SiN films 27, while the SiN film 27 is provided on the outer frame 22, the clearance between the movable portion 23 and the circuit board 240 may be secured by this SiN film 27.

Referring now to FIG. 28A to FIG. 28E, a method for manufacturing the above-described stacked layer type dynamic amount sensor 201 will now be described. As a first step, such a circuit board 240 is prepared which contains the processing circuit 40, the protection film 241 for protecting the processing circuit 40, and the wiring line 161 which is provided within this protection film 241 and is electrically connected to the processing circuit 40. Also, the capacitance type acceleration sensor 20 is prepared which has been formed in the above-described steps of FIG. 5 and FIG. 6.

Figure 28A:
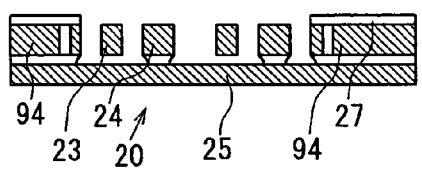
FIG. 28A to FIG. 28E are diagram for showing manufacturing steps of the stacked layer type dynamic amount sensor of FIG. 27, which is provided in the sixteenth embodiment.

As a second step shown in FIG. 28A, the SiN films 27 formed on the movable portion 23 and the fixed portion 24 of the capacitance type acceleration sensor 20 of FIG. 5B are made thin, or are removed. It should be understood that although the SiN film 27 formed on the fixed portion 24 is not always made thin, or not always removed, since there are many possibilities that the movable portion 23 is located close to the fixed portion 24, if all of these SiN films 27 are removed, then the film removing process can be carried out in a higher efficiency.

Figure 28B:
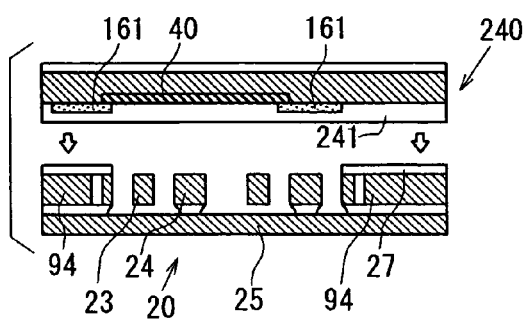

As a third step shown in FIG. 28B, the SiN film 27 of the capacitance type acceleration sensor 20 is directly joined to the plane of the circuit board 240 on the side thereof where the processing circuit 40 is present at the room temperature.

Figure 28C:
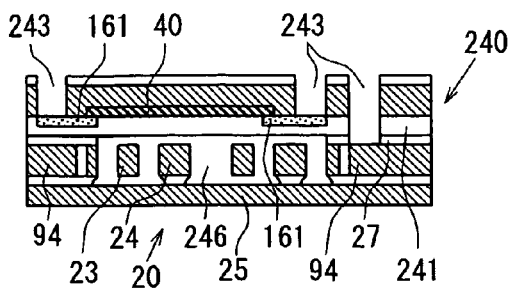

As a fourth step of FIG. 28C, similar to each of the respective embodiments, contact holes 243 are provided by the RIE process. Concretely speaking, one contact hole 243 is formed which passes through the circuit board 240 and is reached to the silicon layer of the fixed portion 24 (and/or movable portion 23) of the capacitance type acceleration sensor 20, and another contact hole 243 is formed which is reached to the wiring line 161 within the circuit board 240.

Figure 28D:
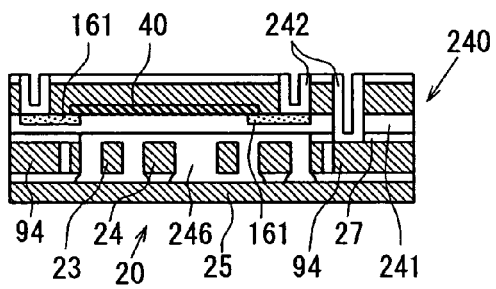

As a fifth step shown in FIG. 28D, an oxide film 242 is deposited on a surface of the contact hole 243 by the CVD method.

Figure 28E:
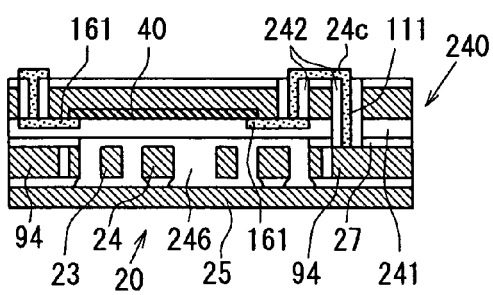

As a sixth step shown in FIG. 28E, after the oxide film 242 is removed which is deposited on the surface of the silicon layer whose potential is equal to that of either the wiring line 161 or the fixed portion 24 (and/or movable portion 23) of the capacitance type acceleration sensor 20, aluminum is deposited on a region which couples the contact hole 243 to the contact hole 243. As a result, either the fixed portion-purpose wiring line 24c (and/or movable portion-purpose wiring line 23c) or the fixed portion 24 (and/or movable portion 23) of the capacitance type acceleration sensor 20 is electrically connected to the processing circuit 40, and also, the output signal of the processing circuit 40 can be derived from the plane of the circuit board 240 on the side thereof where the processing circuit 40 is not formed. Deriving of this output signal of the processing circuit 40 may be carried out by a wire bonding, or by a flip-chip connection. Furthermore, the substance to be deposited is not limited only to aluminum, but also may be made of other metals such as tungsten, or poly-silicon.

With employment of the above-described structure, in accordance with the stacked layer type dynamic amount sensor 201 of the sixteenth embodiment, both the movable portion 23 and the fixed portion 24 can be sealed in the sealing space 246 which is formed by the circuit board 240 and the capacitance type acceleration sensor 20. As a result, such a cap is no longer required which is employed so as to protect both a movable portion and a fixed portion of a capacitance type acceleration sensor, which is not a stacked layer type acceleration sensor. Also, since the processing circuit 40 is similarly present on the side of the above-described sealing space 246, the stacked layer type dynamic amount sensor 201 can have a not-easily-broken structure, and also have such a structure which can be hardly and adversely influenced by contaminations from external environments.

Seventeenth Embodiment

Figure 29:
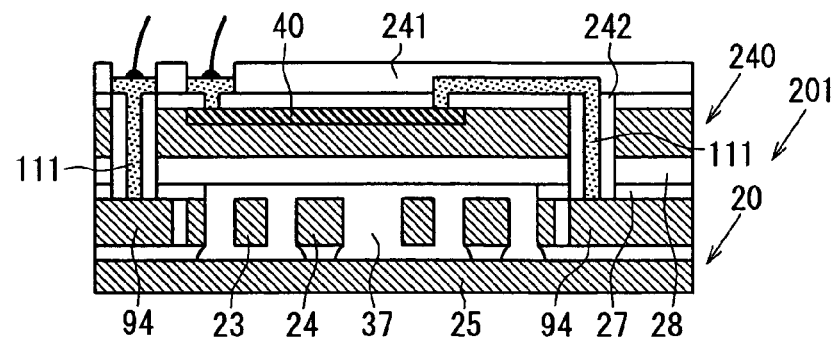
FIG. 29 is a diagram for showing a stacked layer type dynamic amount sensor, which indicates a seventeenth embodiment.

Referring now to FIG. 29, a description is made of a stacked layer type dynamic amount sensor 201 according to a seventeenth embodiment. The seventeenth embodiment has the below-mentioned technical different points from those of the sixteenth embodiment. That is, in this embodiment, a plane of the circuit board 240, on which the processing circuit 40 has been formed, is largely different from the opposite side of the above-described sixteenth embodiment. It should be understood that the same reference numerals shown in the above-described respective embodiments will be employed as those for denoting the same, or similar structural elements in the seventeenth embodiment, and descriptions thereof are omitted.

FIG. 29 is a sectional view for showing the stacked layer type dynamic amount sensor 201 according to the seventeenth embodiment. As indicated in FIG. 29, the processing circuit 40 has been formed on a plane of the circuit board 240, which is located opposite to another plane thereof on which the movable portion 23 and the fixed portion 24 of the capacitance type acceleration sensor are present. In other words, the processing circuit 40 has been formed on such a plane which is located opposite to the stacked plane which stacks the capacitance type acceleration sensor on the circuit board 240.

As previously explained, since the processing circuit 40 is provided on the plane opposite to the stacked plane, a total number of the penetration electrodes 111 can be reduced and the sensor structure can be made simpler, as compared with the sensor structure shown in FIG. 27. Concretely speaking, in such a case where the processing circuit 40 is present on the side of the capacitance type acceleration sensor and the capacitance type acceleration sensor is electrically connected to the processing circuit 40, a signal must be once derived by the penetration electrode 111 to the surface of the circuit board 240, and furthermore, the signal must be inputted to the processing circuit 40 of the circuit board 240 on the side of the sealing space by employing another penetration electrode 111. However, in accordance with the sensor structure of this embodiment, when the capacitance type acceleration sensor is electrically connected to the processing circuit 40, the signal is once derived by the penetration electrode 111 to the surface of the circuit board 240, and may be directly conducted to the processing circuit 40.

Eighteenth Embodiment

Figure 30:
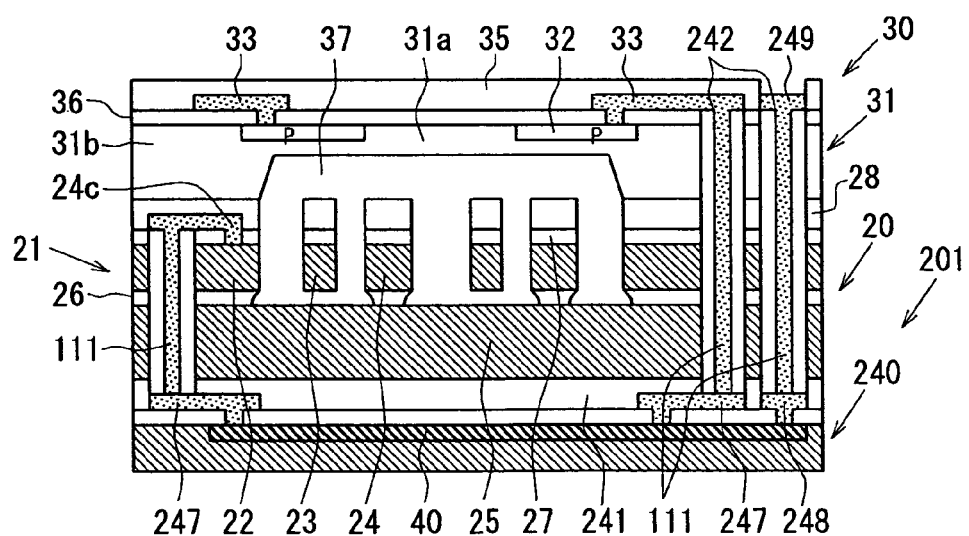
FIG. 30 is a diagram for showing a stacked layer type dynamic amount sensor, which indicates an eighteenth embodiment.

Referring now to FIG. 30, a description is made of a stacked layer type dynamic amount sensor 201 according to an eighteenth embodiment. The eighteenth embodiment has the below-mentioned technical different points from those of the respective embodiments. That is, in this embodiment, piezoelectric type pressure sensor 30, a capacitance type acceleration sensor 20, and a circuit board 240 have been stacked with each other. It should be understood that the same reference numerals shown in the above-described respective embodiments will be employed as those for denoting the same, or similar structural elements in the eighteenth embodiment, and descriptions thereof are omitted.

FIG. 30 is a sectional view for showing the stacked layer type dynamic amount sensor 201 according to the eighteenth embodiment. As indicated in FIG. 30, the capacitance type acceleration sensor 20 has been stacked on the circuit board 240, and furthermore, the piezoelectric type pressure sensor 30 has been stacked on the capacitance type acceleration sensor 20. It should also be understood that structures as to the circuit board 240, the capacitance type acceleration sensor 20, and the piezoelectric type pressure sensor 30 are substantially identical to the structures employed in the above-explained respective embodiments.

Subsequently, a method for manufacturing the above-described stacked layer type dynamic amount sensor 201 will now be described. As a first step, such a circuit board 240 is prepared which contains the processing circuit 40, the protection film 241 for protecting the processing circuit 40, and the wiring line 161 which is provided within this protection film 241 and is electrically connected to the processing circuit 40. Also, a capacitance type acceleration sensor 20 is prepared.

In a second step subsequent to the first step, the supporting substrate side of the capacitance type acceleration sensor 20 is directly joined to the protection film 241 on the circuit board 240 on the side thereof where the processing circuit 40 is present at the room temperature. It should also be noted that this joining process may be replaced by a glass adhesive method, or an anode joining process.

In a third step subsequent to the second step, similar to the above-described respective embodiments, a contact hole is formed until the silicon layer of the movable portion 23 (and fixed portion 24) present under the insulating film 27 (SiN film etc.) of the capacitance type acceleration sensor 20 is exposed by employing the RIE process. Also, another contact hole is similarly formed until the input wiring line 247 of the circuit board 240 is exposed.

In a fourth step subsequent to the third step, aluminum is deposited so as to embed the contact holes formed in the above-described third step, and also, in order that the contact holes are electrically connected to each other by the CVD method, so that the fixed portion-purpose wiring line 24c is produced. It should be noted that the substance to be deposited is not limited only to aluminum, but may be selected from other metals such as tungsten, and poly-silicon.

In a fifth step subsequent to the fourth step, a surface protection film 28 is formed in such a manner that the SiN film 27 of the capacitance type acceleration sensor 20 and the fixed portion-purpose wiring line 24c formed in the third step are covered. Thereafter, both the movable portion and the fixed portion shown in FIG. 5 and FIG. 6 are formed.

In a sixth step subsequent to the fifth step, the diaphragm 31 in which the piezoelectric resistors 32 have been internally provided is prepared, and the ground frame 31b is directly joined to the surface protection film 28 of the capacitance type acceleration sensor 20.

In a seventh step subsequent to the sixth step, a photo-resist mask forming process and a reactive ion etching process (will be referred to as "RIE" process hereinafter) are carried out with respect to the insulating film 36 formed on the piezoelectric resistors 32 of the diaphragm 31 so that a plurality of contact holes are formed in the ground frame 31b. This RIE process is carried out until both an input wiring line 247 and an output wiring line 248 of the circuit board 240 are exposed. In other words, the contact holes correspond to such holes which pass through the ground frame 31b, the surface protection film 28 of the capacitance type acceleration sensor 20, the SiN film 27 of the capacitance type acceleration sensor 20, the N type silicon substrate 21 of the capacitance type acceleration sensor 20, the insulating film 26 of the capacitance type acceleration sensor 20, and the supporting substrate 25 of the capacitance type acceleration sensor 20, and then, are reached to the input wiring line 247 of the circuit board 240.

In an eighth step subsequent to the seventh step, aluminum is deposited in such a manner that the plural contact holes formed in the seventh step are embedded and are electrically connected to each other by executing the CVD process. At this time, the contact hole communicated with the input wiring line 247 of the processing circuit 40 is electrically connected to the contact holes communicated with the piezoelectric resistors 32 by aluminum. Also, poly-silicon is simply deposited in the contact hole communicated with the output wiring line 248, which constitutes the penetration electrodes 111.

In a ninth step subsequent to the eighth step, a surface protection film 35 is provided in such a manner that the surface protection film 35 covers the aluminum and the insulating film 36 on the diaphragm 31 formed in the eighth step. Furthermore, an opening portion is formed in this surface protection film 35 so as to expose an edge portion of the penetration electrode 111 communicated with the output wiring line 248, so that such a pad 249 used to derive an output signal of the processing circuit 40 is formed. It should be noted that the substances to be deposited in the eighth step and the ninth step are not limited only to aluminum, but may be selected from other metals such as tungsten, and poly-silicon.

Subsequently, a description is made of effects achieved by the stacked layer type dynamic amount sensor 201 of the eighteenth embodiment. As a first effect, since the piezoelectric type pressure sensor 30, the capacitance type acceleration sensor 20, and the circuit board 240 are stacked with each other, an area occupied by the sensors can be reduced, as compared with a sensor occupied area of such a structure that a piezoelectric type pressure sensor, a capacitance type acceleration sensor, and a circuit board are separately provided.

Also, as a second effect, under such a condition before the piezoelectric type pressure sensor 30 is adhered to the capacitance type acceleration sensor 20, namely under such a condition that the capacitance type acceleration sensor 20 has been adhered to the circuit board 240, the penetration electrodes 111 are provided, and the output of the capacitance type acceleration sensor 20 can be entered to the processing circuit 40. As a result, the simple structure can be made. Concretely speaking, the structure of this embodiment can reduce a total number of the penetration electrodes 111, as compared with the below-mentioned structure: That is, an output of a capacitance type acceleration sensor is derived up to a diaphragm by a first penetration electrode, and furthermore, the output of the capacitance type acceleration sensor derived up to the diaphragm is entered to a processing circuit by a second penetration electrode which electrically connects the first penetration electrode to the processing circuit.

Nineteenth Embodiment

Figure 31:
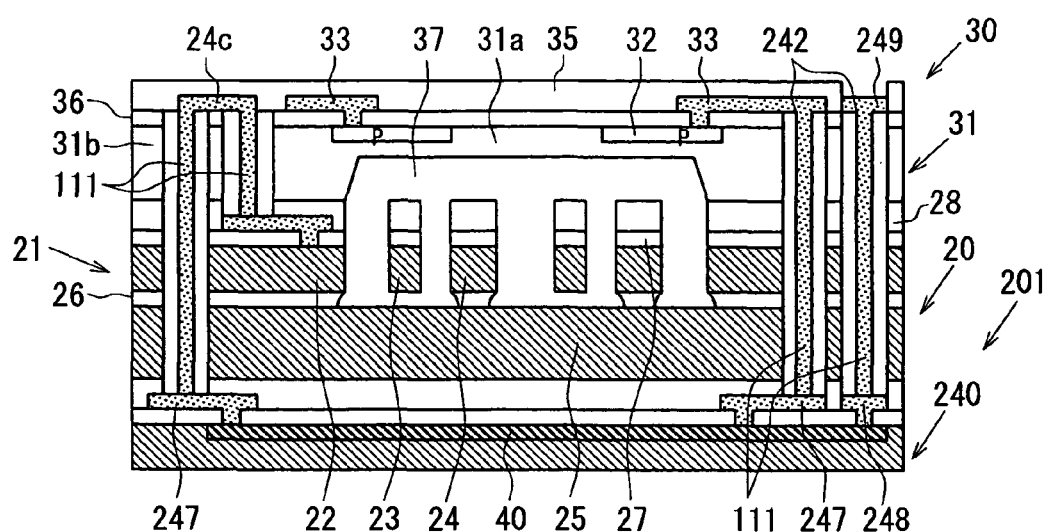
FIG. 31 is a diagram for representing a stacked layer type dynamic amount sensor, which shows a nineteenth embodiment.

Referring now to FIG. 31, a description is made of a stacked layer type dynamic amount sensor 201 according to an nineteenth embodiment. The nineteenth embodiment has the below-mentioned technical different points from those of the eighteenth embodiment. That is, in this embodiment, after the piezoelectric type pressure sensor 30, the capacitance type acceleration sensor 20, and the circuit board 240 have been stacked with each other, all of the penetration electrodes 111 are formed. It should be understood that the same reference numerals shown in the above-described respective embodiments will be employed as those for denoting the same, or similar structural elements in the nineteenth embodiment, and descriptions thereof are omitted.

FIG. 31 is a sectional view for showing the stacked layer type dynamic amount sensor 201 according to the nineteenth embodiment. As indicated in FIG. 31, the capacitance type acceleration sensor 20 has been stacked on the circuit board 240, and further, the piezoelectric type pressure sensor 30 has been stacked on the capacitance acceleration sensor 20. It should also be noted that the circuit board 240, the capacitance type acceleration sensor 20, and the piezoelectric type pressure sensor 30 have the substantially same structures as those of these structural members employed in the above-described respective embodiments.

A technical different point between the above-described eighteenth embodiment shown in FIG. 30 and the present embodiment is given as follows: That is, the plurality of penetration electrodes 111 formed on the diaphragm 31, and the fixed portion wiring line 24c for electrically connecting these penetration electrodes 111 are present. Precisely speaking, one penetration electrode 111 passes through the ground frame 31b from the N type silicon substrate 21 of the capacitance type acceleration sensor 20, and is communicated to the upper portion of the diaphragm 31. The other penetration electrode 111 penetrates the ground frame 31b and the capacitance acceleration sensor 20 from the upper portion of the diaphragm 31, and is communicated to the input wiring line 247 of the processing circuit 40.

Next, a method for manufacturing the above-described stacked layer type dynamic amount sensor 201 of the nineteenth embodiment will now be described. As a first step, such a circuit board 240 is prepared which contains the processing circuit 40, the protection film 241 for protecting the processing circuit 40, and wiring lines 247 and 248 which are provided within this protection film 241 and are electrically connected to the processing circuit 40. Also, the capacitance type acceleration sensor 20 is prepared which has been formed in the above-described steps of FIG. 5 and FIG. 6, and further, the diaphragm 31 is prepared into which the piezoelectric resistors 32 have been internally provided. Then, these circuit board 240, the capacitance type acceleration sensor 20, and diaphragm 31 are adhered to each other by executing the direct joining process at the room temperature.

In a second step subsequent to the first step, a photo-resist mask forming process and a reactive ion etching process (will be referred to as "RIE" process hereinafter) are carried out with respect to the oxide film 36 formed on the piezo electric resistors 32 of the diaphragm 31 so that a plurality of contact holes are formed in the ground frame 31b. This RIE process is carried out until a silicon substrate plane which is electrically connected to the fixed portion 24 of the capacitance type acceleration sensor 20 is exposed, and also another silicon substrate plane which is electrically connected to the movable portion 23 thereof is exposed.

In a third step subsequent to the second step, a photo-resist mask forming process and a reactive ion etching process (will be referred to as "RIE" process hereinafter) are carried out with respect to the oxide film 36 formed on the piezoelectric resistors 32 of the diaphragm 31 so that a plurality of contact holes are formed in the ground frame 31b. This RIE process is carried out until both the input wiring line 247 and the output wiring line 248 of the circuit board 240 are exposed. In other words, the contact holes correspond to such holes which pass through the ground frame 31b, the surface protection film 28 of the capacitance type acceleration sensor 20, the SiN film 27 of the capacitance type acceleration sensor 20, the N type silicon substrate 21 of the capacitance type acceleration sensor 20, the insulating film 26 of the capacitance type acceleration sensor 20, and the supporting substrate 25 of the capacitance type acceleration sensor 20, and then, are reached to the input and output wiring liens 247 and 248 of the circuit board 240.

In a fourth step subsequent to the third step, aluminum is deposited in such a manner that the plural contact holes formed in the second step and the third step are embedded and are electrically connected to each other by executing the CVD process. At this time, the contact hole communicated with the input wiring lien 247 of the processing circuit 40 is electrically connected to the contact holes communicated with the piezoelectric resistors 32 by aluminum so as to constitute the pressure sensor-purpose wiring line 33. Similarly, the contact hole communicated with the input wiring line 247 of the processing circuit 40 is electrically connected to the contact hole communicated with such a silicon layer whose potential is equal to that of the movable portion 23 (and fixed portion 24) of the capacitance type acceleration sensor 20 by aluminum so as to constitute the fixed portion-purpose wiring line 24c. Also, poly-silicon is merely deposited on the contact hole communicated with the output wiring line 248 of the processing circuit 40 so as to constitute the penetration electrode 111. It should also be noted that the substance to be deposited is not limited only to aluminum, but may be selected from other metals such as tungsten, and poly-silicon.

In a fifth step subsequent to the fourth step, the surface protection film 35 is provided in such a manner that the surface protection film 35 covers the poly-silicon and the oxide film 36 on the diaphragm 31 formed in the fourth step. Furthermore, an opening portion is formed in this surface protection film 35 so as to expose the edge portion of the penetration electrode 111 communicated with the output wiring line 248, so that such a pad 249 used to derive an output signal of the processing circuit 40 is formed. As a result, the stacked layer type dynamic amount sensor 201 of FIG. 31 can be manufactured.

Since the above-described structure is provided and the manufacturing method is carried out, the stacked layer type dynamic amount sensor 201 of this embodiment can have the below-mentioned effects: That is, as a first effect, the piezoelectric type pressure sensor 30, the capacitance type acceleration sensor 20, and the circuit board 240 are stacked with each other, and all of the penetration electrodes 111 are formed under such a condition that the movable portion 23 has been sealed in the reference pressure chamber 37. As a result, there is no risk that particles and cleaning water produced when the penetration electrodes 111 are formed enter spaces between the movable portion 23 and the fixed portion 24, which may cause the sticking phenomenon.

As a second effect, the output signal of the capacitance type acceleration sensor 20 is once derived above the diaphragm 31. In this case, for example, if a portion of the surface protection film 35 covered on the diaphragm 31 is removed so as to expose the pressure sensor-purpose wiring line 33 which connects the penetration electrode 111 to the penetration electrode 111, then the capacitance type acceleration sensor 20 can be checked.

Twentieth Embodiment

Figure 32:
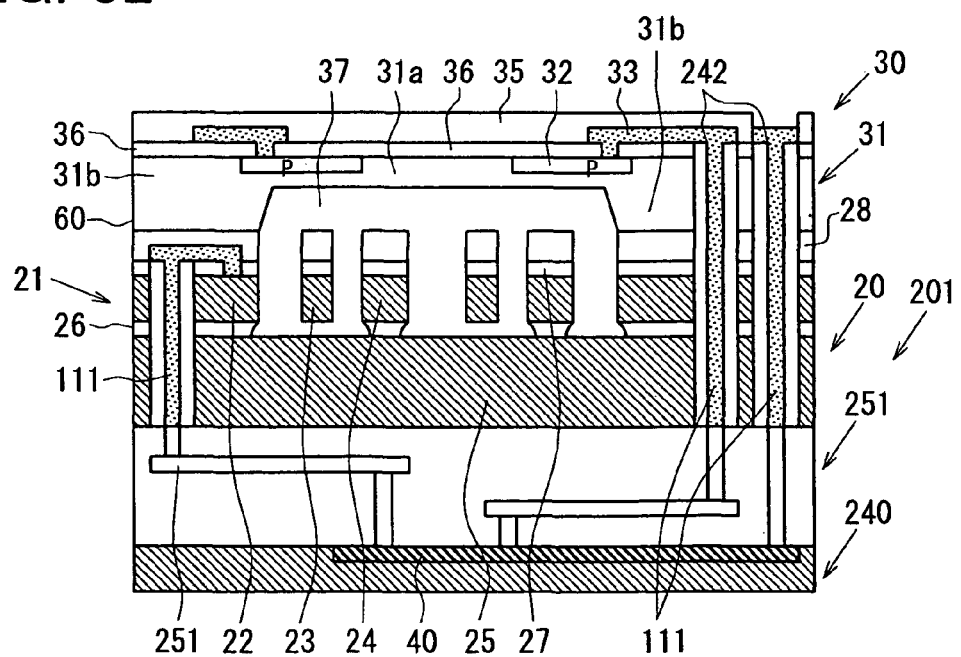
FIG. 32 is a diagram for showing a stacked layer type dynamic amount sensor, which indicates a twentieth embodiment.

Referring now to FIG. 32, a description is made of a stacked layer type dynamic amount sensor 201 according to a twentieth embodiment. The twentieth embodiment has the below-mentioned technical different points from those of the eighteenth embodiment. That is, in this embodiment, a ceramic chip 250 where a wiring line 251 has been provided is sandwiched between the capacitance type acceleration sensor 20 and the circuit board 240. It should be understood that the same reference numerals shown in the above-described respective embodiments will be employed as those for denoting the same, or similar structural elements in the twentieth embodiment, and descriptions thereof are omitted.

FIG. 32 is a sectional view for showing the stacked layer type dynamic amount sensor 201 according to the twentieth embodiment. As indicated in FIG. 32, the ceramic chip 250 where the wiring line 251 has been provided is sandwiched between the capacitance type acceleration sensor 20 and the circuit board 240. While this ceramic chip 250 contains such a structure manufactured by combining an oxide film with the wiring line 251, a peripheral edge portion of the wiring line 251 has been exposed from a predetermined portion (namely, place where wiring line 251 is contacted with below-mentioned penetration electrodes 111). Then, as an entire structure of the stacked layer type dynamic amount sensor 201, the piezoelectric type pressure sensor 30, the capacitance type acceleration sensor 20, the ceramic chip 250, and the circuit board 240 have been sequentially stacked with each other in this order from the pressure application side.

Next, a description is made of a method for manufacturing the stacked layer type dynamic amount sensor 201 of the twentieth embodiment. Firstly, as a first step, such a circuit board 240, the capacitance type acceleration sensor 20 manufactured by the steps shown in FIGS. 5A to 6B described above and the ceramic chip 250 are prepared. The circuit board 240 contains the processing circuit 40 and the protection film 241 which protects the processing unit 40. In the ceramic chip 250, the peripheral edge portion of the wiring line 251 has been exposed at the predetermined portion (place where wiring line 251 is contacted with below-mentioned penetration electrode 111). These circuit board 240, the sensor 20 and ceramic chip 250 are joined to each other by the direct joining process at the room temperature. At this time, the wiring line 251 is electrically connected to the processing circuit 40. It should also be noted that as the substance which constitutes the wiring line 251, metals such as aluminum, copper and tungsten may be employed.

In a second step subsequent to the first step, one penetration electrode 111 is formed in such a manner that the peripheral edge portion of the wiring line 251 is electrically connected to the fixed portion 24 (otherwise, movable portion 23) of the capacitance type acceleration sensor 20. The wiring line 251 has been connected to such a place which is used to process an output signal of the capacitance type acceleration sensor 20 in the processing circuit 40.

In a third step subsequent to the second step, the piezoelectric type pressure sensor 30 is directly joined to the capacitance type acceleration sensor 20.

In a fourth step subsequent to the third step, another penetration electrode 111 is formed in such a manner that the peripheral edge portion of the wiring line 251 is connected to the piezoelectric resistors 32. The wiring line 251 has been connected to such a place which is used to process an output signal of the piezoelectric type pressure sensor 30 in the processing circuit 40. Also, another penetration electrode 111 is formed which is communicated with the peripheral edge portion of the wiring line 251 connected to an output place of an output signal in the processing circuit 40, and drives this output signal above the diaphragm 31. These penetration electrodes 111 have passed through the capacitance type acceleration sensor 20 so as to be connected to the wiring line 251 of the ceramic chip 250.

Since the stacked layer type dynamic amount sensor 201 of this embodiment, which has such a structure, employs the above-described ceramic chip 250, the following effect may be achieved. That is, there is a high freedom degree when the wiring lines are routed. It should also be noted that the present embodiment has exemplified the stacked layer type dynamic amount sensor 201 in the unit of chip. Alternatively, while a plurality of such stacked layer type dynamic amount sensors 201 are integrated on a wafer, these stacked layer type dynamic amount sensors 201 may be manufactured under wafer condition.

Twenty-first Embodiment

Figure 33A:
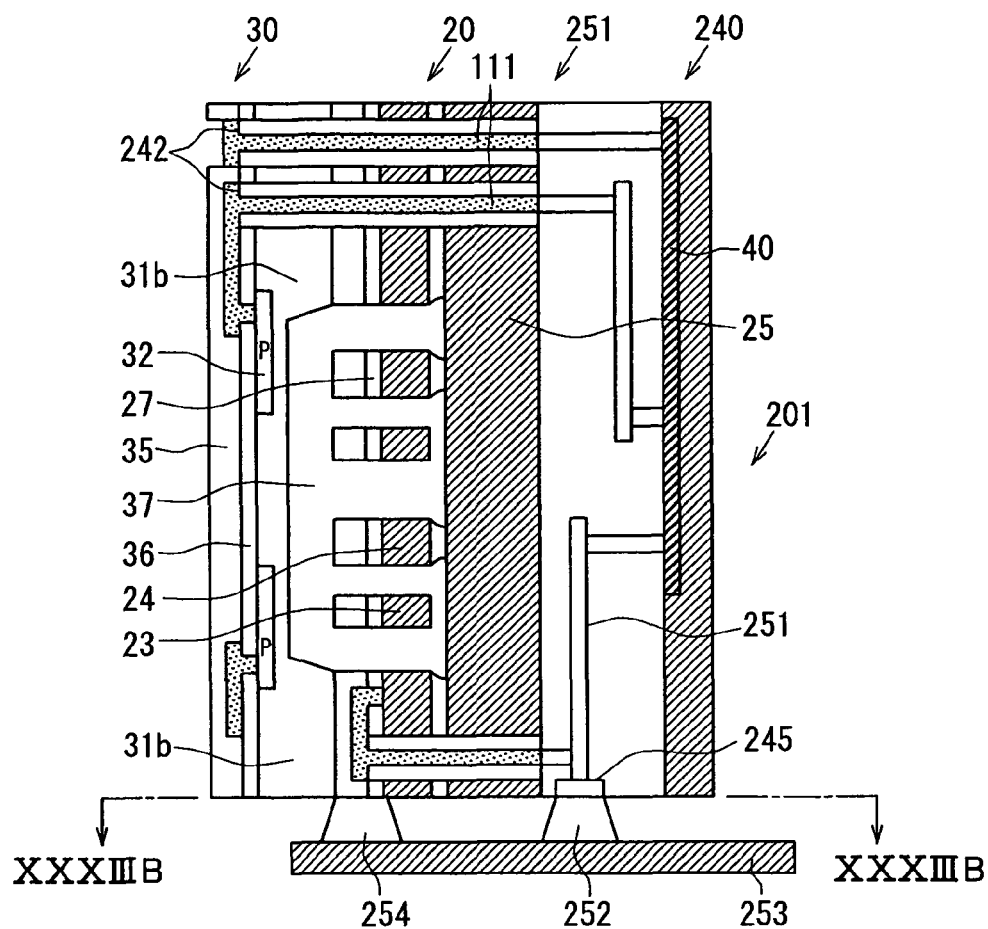
FIG. 33A to FIG. 33B are diagrams for indicating a stacked layer type dynamic amount sensor which shows a twenty-first embodiment.
Figure 33B:
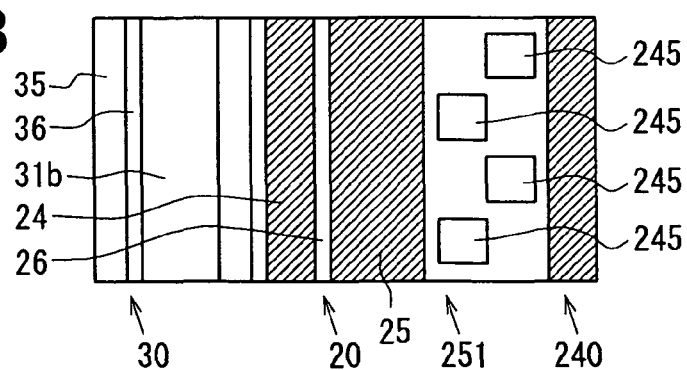
Figure 34:
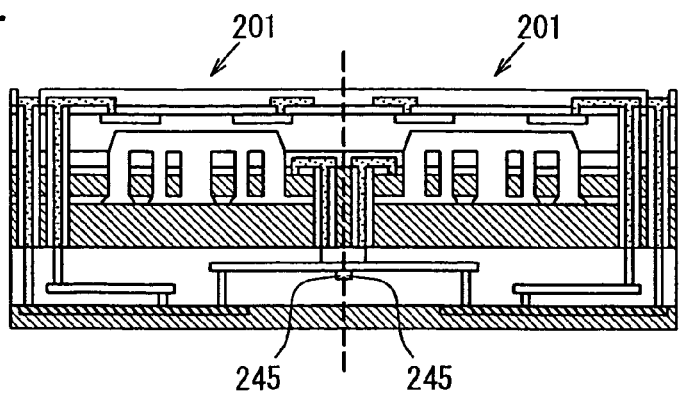
FIG. 34 is a diagram for representing a dicing cut line when stacked layer type dynamic amount sensors are integrated so as to be manufactured, which shows the twenty-first embodiment.

Referring now to FIG. 33A to FIG. 33B and FIG. 34, a description is made of a stacked layer type dynamic amount sensor 201 according to a twenty-first embodiment. The twenty-first embodiment has the below-mentioned technical different points from those of the above-described twentieth embodiment. That is, in this embodiment, a deriving electrode 245 has been provided on a side plane of the ceramic chip 250. It should be understood that the same reference numerals shown in the above-described respective embodiments will be employed as those for denoting the same, or similar structural elements in the twenty-first embodiment, and descriptions thereof are omitted.

FIG. 33A is a sectional view for showing the stacked layer type dynamic amount sensor 201 according to the twenty-first embodiment. FIG. 33B is a sectional view of the sensor 201, taken along a line XXXIIIB-XXXIIIB of FIG. 33A. As shown in FIG. 33A, the deriving electrode 245 has been provided on the side plane of the ceramic chip 250, namely, along a direction perpendicular to a stacking direction of the capacitance type acceleration sensor 20 and the piezoelectric type pressure sensor 30. This deriving electrode 245 has been connected to the wiring line 251 which connects the capacitance type acceleration sensor 20 to the processing circuit 40. In other words, an output signal of the capacitance type acceleration sensor 20 may be derived from this deriving electrode 245. As represented in FIG. 33B, a plurality of such deriving electrodes 245 have been formed on the side plane of the ceramic chip 250. Concretely speaking, various sorts of output signals from the movable portion 23, the fixed portion 24, the piezoelectric resistors 32, and the processing circuit 40 are derived from these deriving electrodes 245 formed on the side plane of the ceramic chip 250. As shown in FIG. 33A, these deriving electrodes 245 have been fixed by a bump joining 252 with respect to lead frames of the package 253, and have been electrically connected thereto. Also, these deriving electrodes 245 have been alternately arranged with respect to the stacking direction. The substance for constructing the wiring line 251 may be selected from metals such as aluminum, copper, and tungsten.

In such a case that a plurality of stacked layer type dynamic amount sensors 201 of this embodiment are manufactured in an integral manner, as represented in FIG. 34, if one deriving electrode 245 and the other deriving electrode 245 are formed by being faced with each other, then the formed deriving electrodes 245 are dicing-cut along a dot line, and thus, one deriving electrode 245 may be divided from the other deriving electrode 245. As other methods than the above-described dicing-cut method, after the structure of FIG. 32 has been formed, the deriving electrodes 245 may be formed by employing the CVD process, or the like. Alternatively, as shown in FIG. 33A, a spacer 254 having a height substantially equal to the height of the bump join 252 is set among the insulating film 26, the SiN film 27, and the package 253, so that the stacked layer type dynamic amount sensor 201 is horizontally supported with respect to the package 253.

Next, a description is made of effects achieved by the stacked layer type dynamic amount sensor 201 of the twenty-first embodiment. As a first effect, the output signals of the respective sensors can be derived from the deriving electrodes 245 formed on the side plane of the ceramic chip 250, so that the stacked layer type dynamic amount sensor 201 can be vertically installed with respect to the bottom plane of the package 253. Also, as a second effect, in addition to the above-described merit that the output signals of the respective sensors can be derived from the deriving electrodes 245 formed on the side plane of the ceramic chip 250, similar to the above-described twentieth embodiment, the output signal of the processing circuit 40 may be derived from the upper portion of the diaphragm 31. In other words, the output signals may be derived from at least 2 planes which have no parallel relationship with each other.

Other Embodiments

In the above-described first to tenth embodiments, either the piezoelectric type pressure sensor or the capacitance type pressure sensor has been stacked with respect to the capacitance type acceleration sensor. However, combinations of these sensors to be stacked are not limited only to the above examples. For example, a capacitance type acceleration sensor may be stacked with respect to a capacitance type angular velocity (yaw rate) sensor, or a pressure sensor may be alternatively be stacked on the capacitance type angular velocity sensor. Also, a piezoelectric resistor type pressure sensor may be alternatively stacked on a piezoelectric resistor type acceleration sensor. Furthermore, acceleration sensors whose detection directions are different from each other may be alternatively stacked with each other in such a manner that these acceleration sensors are located opposite to each other. Also, acceleration sensors for 3 axes may be alternatively formed in such a way that the acceleration sensors for X-axis and Y-axis directions are formed on one substrate, whereas the acceleration sensor for a Z-axis direction is formed on another substrate. Moreover, although the detecting directions are equal to each other, as represented in FIG. 19, acceleration sensors whose sensitivities are different from each other may be alternatively stacked with each other.

In the above-described eleventh to seventeenth embodiments, either the capacitance type acceleration sensor or the piezoelectric type pressure sensor has been stacked on the circuit board. However, combinations of these sensors to be stacked are not limited only to the above example. For instance, a capacitance type angular velocity (yaw rate) sensor may be alternatively stacked on a circuit board, or a capacitance type pressure sensor may be alternatively stacked on the circuit board.

The composite type dynamic amount sensor 1 shown in the above-explained embodiments first to ninth, and the stacked layer type dynamic amount sensor 201 indicated in the twelfth to twenty-first embodiments may be alternatively manufactured in accordance with such a manufacturing method that semiconductor wafer substrates are stacked with each other, and thereafter, the stacked semiconductor wafer substrate may be dicing-cut to obtain the respective chips.

Also, as to stacking methods for semiconductor wafer substrates with each other, when no NCF is interposed between the substrates, a direct joining method at the room temperature, a direct joining method at a high temperature, a glass adhering method, and an anode joining method may be arbitrarily selected.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A physical quantity sensor for detecting a physical quantity comprising:
   a first substrate having a first principal surface and a first backside surface;
   a first element arranged on the first principal surface of the first substrate;
   a second substrate having a second principal surface and a second backside surface;
   a second element arranged on the second principal surface of the second substrate; and
   a first wiring layer and a second wiring layer,
   wherein the first principal surface of the first substrate faces and contacts the second principal surface of the second substrate so that an accommodation space is provided between the first substrate and the second substrate,
   wherein the second substrate includes a first through hole, which penetrates the second substrate from the second backside surface and reaches the first element on the first principal surface,
   wherein the second substrate further includes a second through hole, which penetrates the second substrate from the second backside surface and reaches the second element on the second principal surface,
   wherein the second substrate further includes a first through hole electrode and a second through hole electrode,
   wherein the first through hole electrode is arranged in the first through hole via an insulation film, and the second through hole electrode is arranged in the second through hole via the insulation film,
   wherein the first wiring layer is electrically coupled with the first through hole electrode, and the second wiring layer is electrically coupled with the second through hole electrode,
   wherein the first element is a sensor element having a movable portion, which is disposed in the accommodation space,
   wherein the second element is a semiconductor integrated circuit for processing a signal from the sensor element or for controlling the sensor element, and
   wherein the second element faces the accommodation space.

2. The sensor according to claim 1,
   wherein the first through hole electrode is electrically coupled with the first element,
   wherein the first wiring layer is disposed on the second backside surface, and connects the first through hole electrode and the second through hole electrode, and
   wherein the second wiring layer is disposed on the second principal surface, and connects the second through hole electrode and the second element.

3. The sensor according to claim 1,
   wherein the first substrate is a SOI substrate having an embedded insulation film,
   wherein the movable portion includes a movable electrode, which is movable in the accommodation space along with a direction parallel to the first principal surface of the first substrate in accordance with the physical quantity applied to the sensor,
   wherein the sensor element further includes a fixed electrode, which faces the movable electrode,
   wherein the movable electrode and the fixed electrode provide a capacitor therebetween, and
   wherein the physical quantity is detected based on a capacitance of the capacitor.

4. The sensor according to claim 3,
   wherein a part of the embedded insulation film is removed by a sacrifice layer etching so that the movable electrode is movable.

5. The sensor according to claim 1,
   wherein the first and second through hole electrodes are made of metal or polycrystalline silicon.

6. A physical quantity sensor for detecting a physical quantity comprising:
   a first substrate having a first principal surface and a first backside surface;
   a first element arranged on the first principal surface of the first substrate;
   a second substrate having a second principal surface and a second backside surface;
   a second element arranged on the second principal surface of the second substrate; and
   a first wiring layer,
   wherein the first principal surface of the first substrate faces and contacts the second backside surface of the second substrate so that an accommodation space is provided between the first substrate and the second substrate,
   wherein the second element on the second principal surface is opposite to the accommodation space,
   wherein the second substrate includes a first through hole, which penetrates the second substrate from the second principal surface and reaches the first element on the first principal surface,
   wherein the second substrate further includes a first through hole electrode, which is arranged in the first through hole via an insulation film,
   wherein the first wiring layer is electrically coupled with the first through hole electrode,
   wherein the first element is a sensor element having a movable portion, which is disposed in the accommodation space,
   wherein the second element is a semiconductor integrated circuit for processing a signal from the sensor element or for controlling the sensor element, and
   wherein the second element is disposed opposite to the accommodation space.

7. The sensor according to claim 6,
   wherein the first through hole electrode is electrically coupled with the first element, and
   wherein the first wiring layer is arranged on the second principal surface, and connects the second element and the first through hole electrode.

8. The sensor according to claim 6,
   wherein the first substrate is a SOI substrate having an embedded insulation film,
   wherein the movable portion includes a movable electrode, which is movable in the accommodation space along with a direction parallel to the first principal surface of the first substrate in accordance with the physical quantity applied to the sensor, wherein the sensor element further includes a fixed electrode, which faces the movable electrode, wherein the movable electrode and the fixed electrode provide a capacitor therebetween, and wherein the physical quantity is detected based on a capacitance of the capacitor.

9. The sensor according to claim 8, wherein a part of the embedded insulation film is removed by a sacrifice layer etching so that the movable electrode is movable.

10. The sensor according to claim 6, wherein the first through hole electrode is made of metal or polycrystalline silicon.

11. A physical quantity sensor for detecting a physical quantity comprising:

a first substrate having a first principal surface and a first backside surface;

a first element arranged on the first principal surface of the first substrate;

a second substrate having a second principal surface and a second backside surface;

a second element arranged on the second principal surface of the second substrate; and a first wiring layer and a second wiring layer, wherein the first principal surface of the first substrate faces and contacts the second principal surface of the second substrate so that an accommodation space is provided between the first substrate and the second substrate, wherein the second substrate includes a first through hole, which penetrates the second substrate from the second backside surface and reaches the first element on the first principal surface, wherein the second substrate further includes a second through hole, which penetrates the second substrate from the second backside surface and reaches the second element on the second principal surface, wherein the second substrate further includes a first through hole electrode and a second through hole electrode, wherein the first through hole electrode is arranged in the first through hole via an insulation film, and the second through hole electrode is arranged in the second through hole via the insulation film, wherein the first wiring layer is electrically coupled with the first through hole electrode, and the second wiring layer is electrically coupled with the second through hole electrode, wherein the first element is a sensor element having a movable portion, which is disposed in the accommodation space, wherein the second element is a semiconductor integrated circuit for processing a signal from the sensor element or for controlling the sensor element, wherein the first substrate is a SOI substrate having an embedded insulation film, wherein the movable portion includes a movable electrode, which is movable in the accommodation space along with a direction parallel to the first principal surface of the first substrate in accordance with the physical quantity applied to the sensor, wherein the sensor element further includes a fixed electrode, which faces the movable electrode, wherein the movable electrode and the fixed electrode provide a capacitor therebetween, and wherein the physical quantity is detected based on a capacitance of the capacitor.

12. The sensor according to claim 11, wherein a part of the embedded insulation film is removed by a sacrifice layer etching so that the movable electrode is movable.

13. A physical quantity sensor for detecting a physical quantity comprising:

a first substrate having a first principal surface and a first backside surface;

a first element arranged on the first principal surface of the first substrate;

a second substrate having a second principal surface and a second backside surface;

a second element arranged on the second principal surface of the second substrate; and a first wiring layer, wherein the first principal surface of the first substrate faces and contacts the second backside surface of the second substrate so that an accommodation space is provided between the first substrate and the second substrate, wherein the second element on the second principal surface is opposite to the accommodation space, wherein the second substrate includes a first through hole, which penetrates the second substrate from the second principal surface and reaches the first element on the first principal surface, wherein the second substrate further includes a first through hole electrode, which is arranged in the first through hole via an insulation film, wherein the first wiring layer is electrically coupled with the first through hole electrode, wherein the first element is a sensor element having a movable portion, which is disposed in the accommodation space, wherein the second element is a semiconductor integrated circuit for processing a signal from the sensor element or for controlling the sensor element, wherein the first substrate is a SOI substrate having an embedded insulation film, wherein the movable portion includes a movable electrode, which is movable in the accommodation space along with a direction parallel to the first principal surface of the first substrate in accordance with the physical quantity applied to the sensor, wherein the sensor element further includes a fixed electrode, which faces the movable electrode, wherein the movable electrode and the fixed electrode provide a capacitor therebetween, and wherein the physical quantity is detected based on a capacitance of the capacitor.

14. The sensor according to claim 13, wherein a part of the embedded insulation film is removed by a sacrifice layer etching so that the movable electrode is movable.

* * * * *